(12) United States Patent
Connor et al.

(10) Patent No.: US 10,994,821 B1
(45) Date of Patent: May 4, 2021

(54) AUTONOMOUS LONG-ENDURANCE RF SIGNAL INTERCEPTION SYSTEM

(71) Applicant: ThayerMahan, Inc., Groton, CT (US)

(72) Inventors: Michael Joseph Connor, Mystic, CT (US); Alex Lorman, Mystic, CT (US); William Glennie, Wareham, MA (US)

(73) Assignee: THAYERMAHAN, INC., Groton, CT (US)

(*) Notice: Subject to any disclaimer, the term of this patent is extended or adjusted under 35 U.S.C. 154(b) by 0 days.

(21) Appl. No.: 16/712,507

(22) Filed: Dec. 12, 2019

Related U.S. Application Data

(60) Provisional application No. 62/778,500, filed on Dec. 12, 2018.

(51) Int. Cl.
| | |
|---|---|
| *B63G 8/00* | (2006.01) |
| *G05D 1/00* | (2006.01) |
| *G05D 1/02* | (2020.01) |
| *H05K 1/02* | (2006.01) |
| *H04K 3/00* | (2006.01) |
| *G05D 1/08* | (2006.01) |

(52) U.S. Cl.
CPC ........... *B63G 8/001* (2013.01); *G05D 1/0022* (2013.01); *G05D 1/0206* (2013.01); *G05D 1/0875* (2013.01); *H04K 3/827* (2013.01); *H05K 1/0237* (2013.01); *B63G 2008/004* (2013.01)

(58) Field of Classification Search
CPC .............. B63G 8/001; B63G 2008/004; G05D 1/0022; G05D 1/0206; G05D 1/0875; H04K 3/827
See application file for complete search history.

(56) References Cited

U.S. PATENT DOCUMENTS

| | | | | |
|---|---|---|---|---|
| 5,076,192 | A * | 12/1991 | Tegel | F41F 3/042 114/316 |
| 5,675,116 | A * | 10/1997 | Hillenbrand | B63G 8/22 114/21.2 |
| 5,995,882 | A * | 11/1999 | Patterson | B63C 11/42 114/312 |
| 7,068,998 | B2 | 6/2006 | Zavidniak | |
| 8,195,188 | B2 * | 6/2012 | Fomukong | H04W 8/10 455/456.1 |
| 9,584,252 | B1 * | 2/2017 | Salyers | H04K 3/80 |
| 10,065,717 | B1 * | 9/2018 | Husain | B63G 8/001 |
| 10,207,816 | B1 * | 2/2019 | Husain | G01S 1/00 |
| 10,405,184 | B2 * | 9/2019 | Gallagher | H04W 12/0802 |
| 10,768,274 | B2 | 9/2020 | Lebourg et al. | |
| 2015/0298786 | A1 * | 10/2015 | Stigler | B64B 1/36 244/30 |
| 2016/0244135 | A1 * | 8/2016 | Farber | B63G 8/001 |
| 2017/0227638 | A1 * | 8/2017 | Nicoletti | G01S 15/89 |

* cited by examiner

*Primary Examiner* — S. Joseph Morano
*Assistant Examiner* — Jovon E Hayes
(74) *Attorney, Agent, or Firm* — Wilson Sonsini Goodrich & Rosati

(57) ABSTRACT

Described herein are unmanned water vehicles, platforms, and media for stealthy, low-power, and long range electronic warfare and signals intelligence. The unmanned water vehicles, platforms, and media herein are capable of capturing communication between ships, land and air and ground stations across multiple spectra, and transmitting real-time disambiguated transmission recordings and source positions.

38 Claims, 10 Drawing Sheets ial signal interception system comprising: a
High Frequency (HF) antenna array configured to receive a
HF signal; a Very High Frequency (VHF) antenna array
AUTONOMOUS LONG-ENDURANCE RF SIGNAL INTERCEPTION SYSTEM

CROSS-REFERENCE TO RELATED APPLICATIONS

This application claims the benefit of U.S. App. Ser. No. 62/778,500, filed Dec. 12, 2018, which is hereby incorporated by reference in its entirety.

BACKGROUND

The information disclosed and claimed below relates generally to signal interception, recording, and intelligence. Scientists, sailors, and solders have long performed angle of arrival calculations to locate the source of captured signals.

SUMMARY

One aspect provided herein is an unmanned water vehicle for signal interception, recording, and intelligence comprising a physical signals interception system comprising: a High Frequency (HF) antenna array configured to receive a HF signal; a Very High Frequency (VHF) antenna array configured to receive a VHF signal; at least one sensor configured to measure a sensed data corresponding to a position and an orientation of the unmanned water vehicle; a vehicle communications device; and a vehicle processor configured to provide a payload application comprising: a signal interception module configured to: receive the sensed data, the HF signal, and the VHF signal; and determining a position of origin of at least one of the HF signal and the VHF signal by geo-correlating at least one of the position and orientation of the unmanned water vehicle; and a data exfiltration module transmitting at least one of the HF signal, the VHF signal, the position of the unmanned water vehicle, the orientation of the unmanned water vehicle, and the position of origin via the water vehicle communications device.

In some embodiments, the unmanned water vehicle further comprises an energy storage device. In some embodiments, the energy storage device comprises a battery, a supercapacitor, a hybrid supercapacitor, a spring, or any combination thereof. In some embodiments, the position comprises a GPS position. In some embodiments, the at least one sensor comprises a GPS sensor. In some embodiments, the at least one sensor comprises a non-GPS sensor. In some embodiments, the non-GPS sensor comprises a compass, a sextant, a camera, an inertial sensor, or any combination thereof. In some embodiments, the orientation comprises a pitch angle, a roll angle, and a yaw angle. In some embodiments, the unmanned water vehicle further comprises an energy harvesting device. In some embodiments, the energy harvesting device comprises a solar panel, a wind turbine, a kite, a buoy, or any combination thereof. In some embodiments, at least one of the HF signal and the VHF signal comprises a signal emitted by a ship, a ground station, or an aircraft. In some embodiments, the HF signal comprises a first spectrum of HF signals and wherein the VHF signal comprises a second spectrum of VHF signals. In some embodiments, the HF antenna array comprises two HF antennas separated by a HF baseline distance.

In some embodiments, the HF baseline distance is about 2.5 m to about 25 m. In some embodiments, the HF baseline distance is at least about 2.5 m. In some embodiments, the HF baseline distance is at most about 25 m. In some embodiments, the HF baseline distance is about 2.5 m to about 3 m, about 2.5 m to about 4 m, about 2.5 m to about 5 m, about 2.5 m to about 6 m, about 2.5 m to about 8 m, about 2.5 m to about 10 m, about 2.5 m to about 12 m, about 2.5 m to about 15 m, about 2.5 m to about 20 m, about 2.5 m to about 25 m, about 3 m to about 4 m, about 3 m to about 5 m, about 3 m to about 6 m, about 3 m to about 8 m, about 3 m to about 10 m, about 3 m to about 12 m, about 3 m to about 15 m, about 3 m to about 20 m, about 3 m to about 25 m, about 4 m to about 5 m, about 4 m to about 6 m, about 4 m to about 8 m, about 4 m to about 10 m, about 4 m to about 12 m, about 4 m to about 15 m, about 4 m to about 20 m, about 4 m to about 25 m, about 5 m to about 6 m, about 5 m to about 8 m, about 5 m to about 10 m, about 5 m to about 12 m, about 5 m to about 15 m, about 5 m to about 20 m, about 5 m to about 25 m, about 6 m to about 8 m, about 6 m to about 10 m, about 6 m to about 12 m, about 6 m to about 15 m, about 6 m to about 20 m, about 6 m to about 25 m, about 8 m to about 10 m, about 8 m to about 12 m, about 8 m to about 15 m, about 8 m to about 20 m, about 8 m to about 25 m, about 10 m to about 12 m, about 10 m to about 15 m, about 10 m to about 20 m, about 10 m to about 25 m, about 12 m to about 15 m, about 12 m to about 20 m, about 12 m to about 25 m, about 15 m to about 20 m, about 15 m to about 25 m, or about 20 m to about 25 m. In various embodiments, the HF baseline distance is about 2.5 m, about 3 m, about 4 m, about 5 m, about 6 m, about 8 m, about 10 m, about 12 m, about 15 m, about 20 m, or about 25 m, including increments therein.

In some embodiments, the VHF antenna array comprises a circular array of VHF antennas, a rectilinear array of VHF antennas, or a phased array of VHF antennas.

In some embodiments, the circular VHF antenna array has a diameter of about 0.2 m to about 1 m. In some embodiments, the circular VHF antenna array has a diameter of at least about 0.2 m. In some embodiments, the circular VHF antenna array has a diameter of at most about 1 m. In some embodiments, the circular VHF antenna array has a diameter of about 0.2 m to about 0.3 m, about 0.2 m to about 0.4 m, about 0.2 m to about 0.5 m, about 0.2 m to about 0.6 m, about 0.2 m to about 0.7 m, about 0.2 m to about 0.8 m, about 0.2 m to about 0.9 m, about 0.2 m to about 1 m, about 0.3 m to about 0.4 m, about 0.3 m to about 0.5 m, about 0.3 m to about 0.6 m, about 0.3 m to about 0.7 m, about 0.3 m to about 0.8 m, about 0.3 m to about 0.9 m, about 0.3 m to about 1 m, about 0.4 m to about 0.5 m, about 0.4 m to about 0.6 m, about 0.4 m to about 0.7 m, about 0.4 m to about 0.8 m, about 0.4 m to about 0.9 m, about 0.4 m to about 1 m, about 0.5 m to about 0.6 m, about 0.5 m to about 0.7 m, about 0.5 m to about 0.8 m, about 0.5 m to about 0.9 m, about 0.5 m to about 1 m, about 0.6 m to about 0.7 m, about 0.6 m to about 0.8 m, about 0.6 m to about 0.9 m, about 0.6 m to about 1 m, about 0.7 m to about 0.8 m, about 0.7 m to about 0.9 m, about 0.7 m to about 1 m, about 0.8 m to about 0.9 m, about 0.8 m to about 1 m, or about 0.9 m to about 1 m. In various embodiments, the circular VHF antenna array has a diameter of about 0.2 m, about 0.3 m, about 0.4 m, about 0.5 m, about 0.6 m, about 0.7 m, about 0.8 m, about 0.9 m, or about 1 m, including increments therein.

In some embodiments, the VHF antenna array further comprises a counterpoise VHF antenna. In some embodiments, the VHF antenna array comprises four counterpoise VHF antennas and wherein each counterpoise VHF antenna is generally coaxial with one VHF antenna. In some embodiments, the unmanned water vehicle further comprises a stanchion, and wherein at least one of the HF array and the VHF array is attached to the stanchion.

In some embodiments, the stanchion has a height of about 0.8 m to about 8 m. In some embodiments, the stanchion has a height of at least about 0.8 m. In some embodiments, the stanchion has a height of at most about 8 m. In some embodiments, the stanchion has a height of about 0.8 m to about 1 m, about 0.8 m to about 2 m, about 0.8 m to about 3 m, about 0.8 m to about 4 m, about 0.8 m to about 5 m, about 0.8 m to about 6 m, about 0.8 m to about 7 m, about 0.8 m to about 8 m, about 1 m to about 2 m, about 1 m to about 3 m, about 1 m to about 4 m, about 1 m to about 5 m, about 1 m to about 6 m, about 1 m to about 7 m, about 1 m to about 8 m, about 2 m to about 3 m, about 2 m to about 4 m, about 2 m to about 5 m, about 2 m to about 6 m, about 2 m to about 7 m, about 2 m to about 8 m, about 3 m to about 4 m, about 3 m to about 5 m, about 3 m to about 6 m, about 3 m to about 7 m, about 3 m to about 8 m, about 4 m to about 5 m, about 4 m to about 6 m, about 4 m to about 7 m, about 4 m to about 8 m, about 5 m to about 6 m, about 5 m to about 7 m, about 5 m to about 8 m, about 6 m to about 7 m, about 6 m to about 8 m, or about 7 m to about 8 m. In various embodiments, the stanchion has a height of about 0.8 m, about 1 m, about 2 m, about 3 m, about 4 m, about 5 m, about 6 m, about 7 m, or about 8 m, including increments therein.

In some embodiments, the reception area of at least one of the HF array and the VHF array is about 5 km to about 200 km. In some embodiments, the reception area of at least one of the HF array and the VHF array is at least about 5 km. In some embodiments, the reception area of at least one of the HF array and the VHF array is at most about 200 km. In some embodiments, the reception area of at least one of the HF array and the VHF array is about 5 km to about 10 km, about 5 km to about 25 km, about 5 km to about 50 km, about 5 km to about 75 km, about 5 km to about 100 km, about 5 km to about 125 km, about 5 km to about 150 km, about 5 km to about 175 km, about 5 km to about 200 km, about 10 km to about 25 km, about 10 km to about 50 km, about 10 km to about 75 km, about 10 km to about 100 km, about 10 km to about 125 km, about 10 km to about 150 km, about 10 km to about 175 km, about 10 km to about 200 km, about 25 km to about 50 km, about 25 km to about 75 km, about 25 km to about 100 km, about 25 km to about 125 km, about 25 km to about 150 km, about 25 km to about 175 km, about 25 km to about 200 km, about 50 km to about 75 km, about 50 km to about 100 km, about 50 km to about 125 km, about 50 km to about 150 km, about 50 km to about 175 km, about 50 km to about 200 km, about 75 km to about 100 km, about 75 km to about 125 km, about 75 km to about 150 km, about 75 km to about 175 km, about 75 km to about 200 km, about 100 km to about 125 km, about 100 km to about 150 km, about 100 km to about 175 km, about 100 km to about 200 km, about 125 km to about 150 km, about 125 km to about 175 km, about 125 km to about 200 km, about 150 km to about 175 km, about 150 km to about 200 km, or about 175 km to about 200 km. In various embodiments, the reception area of at least one of the HF array and the VHF array is about 5 km, about 10 km, about 25 km, about 50 km, about 75 km, about 100 km, about 125 km, about 150 km, about 175 km, or about 200 km, including increments therein.

In some embodiments, the sensor comprises a GPS sensor configured to measure a GPS data, an accelerometer configured to measure an acceleration data, a tilt sensor configured to measure a tilt data, an inertial sensor configured to measure an inertial data, a compass configured to measure a heading, a potentiometer configured to measure an angle, an Automatic Identification System (AIS) sensor configured to measure an AIS data, or any combination thereof. In some embodiments, the sensor consists of a GPS sensor and at least one of the inertial sensor, the compass, and the AIS sensor, and wherein the signal interception module determines the position of origin of at least one of the HF signal and the VHF signal based on at least one of the inertial data and the magnetic data if the position of the unmanned water vehicle is within a GPS denied environment. In some embodiments, vehicle communications device comprises a satellite communication device, a Wi-Fi communication device, an RFID communication device, a Bluetooth communication device, a mesh network communication device, an over-the-horizon communication device, or any combination thereof. In some embodiments, the vehicle communications device consists of the Wi-Fi communication device and wherein the Wi-Fi communication device is only enabled for local diagnostics. In some embodiments, the unmanned water vehicle further comprises a propulsion and steering system configured to modify the position and the orientation of the unmanned water vehicle. In some embodiments, the propulsion and steering system comprises a motor, a wave glider, a rudder, a propeller, an anchor, a sail, a kite, a jet, or any combination thereof. In some embodiments, the signal interception module determines the position of origin of the HF signal by determining a false direction and a true direction of the HF signal from HF signals received during two or more discrete times. In some embodiments, the signal interception module determines the position of origin of the HF signal by: calculating a phase difference of the arrival of the HF signal received by the HF array; calculating a signal strength difference of the HF signal received by the HF array; or both. In some embodiments, the direction finding module determines the position of origin of the VHF signal by: calculating a phase difference of arrival of the VHF signal received by the VHF array; calculating a signal strength difference of the VHF signal received by the VHF array; or both. In some embodiments, the payload application further comprises a memory module storing one or more of the HF signal, the VHF signal, the position of origin of the HF signal, and the position of origin of the VHF signal. In some embodiments, the memory module only stores at least one of the HF signal, the VHF signal, the position of origin of the HF signal, and the position of origin of the VHF signal if at least one of the HF signal and the VHF signal has: a signal-to-noise value below a set noise threshold; a frequency within a set frequency range; an amplitude above a set amplitude value; or any combination thereof. In some embodiments, the communications device only transmits at least one of the HF signal, the VHF signal, the position of origin of the HF signal, and the position of origin of the VHF signal if at least one of the HF signal and the VHF signal has: a signal-to-noise value below a set noise threshold; a frequency within a set frequency range; an amplitude above a set amplitude value; or any combination thereof. In some embodiments, the payload application further comprises an encryption module encrypting at least one of the HF signal, the VHF signal, the position of origin of the HF signal, and the position of origin of the VHF signal. In some embodiments, the vehicle communications device transmits at least one of the HF signal, the VHF signal, the position of origin of the HF signal, and the position of origin of the VHF signal by VPN, WebSocket, JSON, HTTP, HTTPS, or any combination thereof. In some embodiments, the unmanned water vehicle is capable of continuous operation for at least 45 days without maintenance or charging.

Another aspect provided herein unmanned water-based signal interception, recording, and intelligence platform comprising: an unmanned water vehicle comprising: a High Frequency (HF) antenna array configured to receive a HF signal; a Very High Frequency (VHF) antenna array configured to receive a VHF signal; at least one sensor configured to measure a sensed data corresponding to the position and the orientation of the unmanned water vehicle; a vehicle communications device; and a vehicle processor configured to provide a payload application comprising: a signal interception module configured to: receive the sensed data, the HF signal, and the VHF signal; and determining a position of origin of at least one of the HF signal and the VHF signal by geo-correlating at least one of the position and orientation of the unmanned water vehicle; and a data exfiltration module transmitting at least one of the HF signal, the VHF signal, the position of the unmanned water vehicle, the orientation of the unmanned water vehicle, and the position of origin via the water vehicle communications device; and a control station comprising a control station processor configured to provide a shoreside application comprising a communication module receiving the position of origin and at least one of the position and orientation of the unmanned water vehicle.

In some embodiments, the unmanned water vehicle further comprises an energy storage device. In some embodiments, the energy storage device comprises a battery, a supercapacitor, a hybrid supercapacitor, a spring, or any combination thereof. In some embodiments, the position comprises a GPS position. In some embodiments, the orientation comprises a pitch angle, a roll angle, and a yaw angle. In some embodiments, the unmanned water vehicle further comprises an energy harvesting device. In some embodiments, the energy harvesting device comprises a solar panel, a wind turbine, a kite, a buoy, or any combination thereof. In some embodiments, at least one of the HF signal and the VHF signal comprises a signal emitted by a ship, a ground station, or an aircraft. In some embodiments, the HF signal comprises a first spectrum of HF signals and wherein the VHF signal comprises a second spectrum of VHF signals. In some embodiments, the HF antenna array comprises two HF antennas separated by a HF baseline distance.

In some embodiments, the HF baseline distance is about 2.5 m to about 25 m. In some embodiments, the HF baseline distance is at least about 2.5 m. In some embodiments, the HF baseline distance is at most about 25 m. In some embodiments, the HF baseline distance is about 2.5 m to about 3 m, about 2.5 m to about 4 m, about 2.5 m to about 5 m, about 2.5 m to about 6 m, about 2.5 m to about 8 m, about 2.5 m to about 10 m, about 2.5 m to about 12 m, about 2.5 m to about 15 m, about 2.5 m to about 20 m, about 2.5 m to about 25 m, about 3 m to about 4 m, about 3 m to about 5 m, about 3 m to about 6 m, about 3 m to about 8 m, about 3 m to about 10 m, about 3 m to about 12 m, about 3 m to about 15 m, about 3 m to about 20 m, about 3 m to about 25 m, about 4 m to about 5 m, about 4 m to about 6 m, about 4 m to about 8 m, about 4 m to about 10 m, about 4 m to about 12 m, about 4 m to about 15 m, about 4 m to about 20 m, about 4 m to about 25 m, about 5 m to about 6 m, about 5 m to about 8 m, about 5 m to about 10 m, about 5 m to about 12 m, about 5 m to about 15 m, about 5 m to about 20 m, about 5 m to about 25 m, about 6 m to about 8 m, about 6 m to about 10 m, about 6 m to about 12 m, about 6 m to about 15 m, about 6 m to about 20 m, about 6 m to about 25 m, about 8 m to about 10 m, about 8 m to about 12 m, about 8 m to about 15 m, about 8 m to about 20 m, about 8 m to about 25 m, about 10 m to about 12 m, about 10 m to about 15 m, about 10 m to about 20 m, about 10 m to about 25 m, about 12 m to about 15 m, about 12 m to about 20 m, about 12 m to about 25 m, about 15 m to about 20 m, about 15 m to about 25 m, or about 20 m to about 25 m. In various embodiments, the HF baseline distance is about 2.5 m, about 3 m, about 4 m, about 5 m, about 6 m, about 8 m, about 10 m, about 12 m, about 15 m, about 20 m, or about 25 m, including increments therein.

In some embodiments, the VHF antenna array comprises a circular array of VHF antennas, a rectilinear array of VHF antennas, or a phased array of VHF antennas.

In some embodiments, the circular VHF antenna array has a diameter of about 0.2 m to about 1 m. In some embodiments, the circular VHF antenna array has a diameter of at least about 0.2 m. In some embodiments, the circular VHF antenna array has a diameter of at most about 1 m. In some embodiments, the circular VHF antenna array has a diameter of about 0.2 m to about 0.3 m, about 0.2 m to about 0.4 m, about 0.2 m to about 0.5 m, about 0.2 m to about 0.6 m, about 0.2 m to about 0.7 m, about 0.2 m to about 0.8 m, about 0.2 m to about 0.9 m, about 0.2 m to about 1 m, about 0.3 m to about 0.4 m, about 0.3 m to about 0.5 m, about 0.3 m to about 0.6 m, about 0.3 m to about 0.7 m, about 0.3 m to about 0.8 m, about 0.3 m to about 0.9 m, about 0.3 m to about 1 m, about 0.4 m to about 0.5 m, about 0.4 m to about 0.6 m, about 0.4 m to about 0.7 m, about 0.4 m to about 0.8 m, about 0.4 m to about 0.9 m, about 0.4 m to about 1 m, about 0.5 m to about 0.6 m, about 0.5 m to about 0.7 m, about 0.5 m to about 0.8 m, about 0.5 m to about 0.9 m, about 0.5 m to about 1 m, about 0.6 m to about 0.7 m, about 0.6 m to about 0.8 m, about 0.6 m to about 0.9 m, about 0.6 m to about 1 m, about 0.7 m to about 0.8 m, about 0.7 m to about 0.9 m, about 0.7 m to about 1 m, about 0.8 m to about 0.9 m, about 0.8 m to about 1 m, or about 0.9 m to about 1 m. In various embodiments, the circular VHF antenna array has a diameter of about 0.2 m, about 0.3 m, about 0.4 m, about 0.5 m, about 0.6 m, about 0.7 m, about 0.8 m, about 0.9 m, or about 1 m, including increments therein.

In some embodiments, the VHF antenna array comprises a counterpoise VHF antenna. In some embodiments, the VHF antenna array comprises four counterpoise VHF antennas and wherein each counterpoise VHF antenna is generally coaxial with one VHF antenna. In some embodiments, the unmanned water vehicle further comprises a stanchion, and wherein at least one of the HF array and the VHF array is attached to the stanchion.

In some embodiments, the stanchion has a height of about 0.8 m to about 8 m. In some embodiments, the stanchion has a height of at least about 0.8 m. In some embodiments, the stanchion has a height of at most about 8 m. In some embodiments, the stanchion has a height of about 0.8 m to about 1 m, about 0.8 m to about 2 m, about 0.8 m to about 3 m, about 0.8 m to about 4 m, about 0.8 m to about 5 m, about 0.8 m to about 6 m, about 0.8 m to about 7 m, about 0.8 m to about 8 m, about 1 m to about 2 m, about 1 m to about 3 m, about 1 m to about 4 m, about 1 m to about 5 m, about 1 m to about 6 m, about 1 m to about 7 m, about 1 m to about 8 m, about 2 m to about 3 m, about 2 m to about 4 m, about 2 m to about 5 m, about 2 m to about 6 m, about 2 m to about 7 m, about 2 m to about 8 m, about 3 m to about 4 m, about 3 m to about 5 m, about 3 m to about 6 m, about 3 m to about 7 m, about 3 m to about 8 m, about 4 m to about 5 m, about 4 m to about 6 m, about 4 m to about 7 m, about 4 m to about 8 m, about 5 m to about 6 m, about 5 m to about 7 m, about 5 m to about 8 m, about 6 m to about 7 m, about 6 m to about 8 m, or about 7 m to about 8 m. In various embodiments, the stanchion has a height of about 0.8 m, about 1 m, about 2 m, about 3 m, about 4 m, about 5 m, about 6 m, about 7 m, or about 8 m, including increments therein.

In some embodiments, the reception area of at least one of the HF array and the VHF array is about 5 km to about 200 km. In some embodiments, the reception area of at least one of the HF array and the VHF array is at least about 5 km. In some embodiments, the reception area of at least one of the HF array and the VHF array is at most about 200 km. In some embodiments, the reception area of at least one of the HF array and the VHF array is about 5 km to about 10 km, about 5 km to about 25 km, about 5 km to about 50 km, about 5 km to about 75 km, about 5 km to about 100 km, about 5 km to about 125 km, about 5 km to about 150 km, about 5 km to about 175 km, about 5 km to about 200 km, about 10 km to about 25 km, about 10 km to about 50 km, about 10 km to about 75 km, about 10 km to about 100 km, about 10 km to about 125 km, about 10 km to about 150 km, about 10 km to about 175 km, about 10 km to about 200 km, about 25 km to about 50 km, about 25 km to about 75 km, about 25 km to about 100 km, about 25 km to about 125 km, about 25 km to about 150 km, about 25 km to about 175 km, about 25 km to about 200 km, about 50 km to about 75 km, about 50 km to about 100 km, about 50 km to about 125 km, about 50 km to about 150 km, about 50 km to about 175 km, about 50 km to about 200 km, about 75 km to about 100 km, about 75 km to about 125 km, about 75 km to about 150 km, about 75 km to about 175 km, about 75 km to about 200 km, about 100 km to about 125 km, about 100 km to about 150 km, about 100 km to about 175 km, about 100 km to about 200 km, about 125 km to about 150 km, about 125 km to about 175 km, about 125 km to about 200 km, about 150 km to about 175 km, about 150 km to about 200 km, or about 175 km to about 200 km. In various embodiments, the reception area of at least one of the HF array and the VHF array is about 5 km, about 10 km, about 25 km, about 50 km, about 75 km, about 100 km, about 125 km, about 150 km, about 175 km, or about 200 km, including increments therein.

In some embodiments, the sensor comprises a GPS sensor, an accelerometer, a tilt sensor, an inertial sensor, a compass, a magnetic sensor, a kinematic sensor, or any combination thereof. In some embodiments, the sensor consists of a GPS sensor and at least one of (A) an inertial sensor configured to measure an inertial data and (B) a magnetic sensor configured to measure a magnetic data, and wherein the signal interception module determines the position of origin of at least one of the HF signal and the VHF signal based on at least one of the inertial data and the magnetic data if the position of the platform is within a GPS denied environment. In some embodiments, the vehicle communications device comprises a satellite communication device, a Wi-Fi communication device, an RFID communication device, a Bluetooth communication device, a mesh network communication device, an over-the-horizon communication device, or any combination thereof. In some embodiments, the vehicle communications device consists of the Wi-Fi communication device, and wherein the Wi-Fi communication device is only enabled for local diagnostics. In some embodiments, the unmanned water vehicle further comprises a propulsion and steering system configured to modify the position and the orientation of the platform. In some embodiments, the propulsion and steering system comprises a motor, a wave glider, a rudder, a propeller, an anchor, a sail, a kite, a jet, or any combination thereof. In some embodiments, the signal interception module determines the position of origin of the HF signal by determining a false direction and a true direction of the HF signal from HF signals received during two or more discrete times. In some embodiments, the signal interception module determines the position of origin of the HF signal by: calculating a phase difference of the arrival of the HF signal received by the HF array; calculating a signal strength difference of the HF signal received by the HF array, or both. In some embodiments, the direction finding module determines the position of origin of the VHF signal by: calculating a phase difference of arrival of the VHF signal received by the VHF array; calculating a signal strength difference of the VHF signal received by the VHF array, or both. In some embodiments, the payload application further comprises a memory module storing one or more of the HF signal, the VHF signal, the position of origin of the HF signal, and the position of origin of the VHF signal. In some embodiments, the memory module only stores at least one of the HF signal, the VHF signal, the position of origin of the HF signal, and the position of origin of the VHF signal if at least one of the HF signal and the VHF signal has: a signal-to-noise value below a set noise threshold; a frequency within a set frequency range; an amplitude above a set amplitude value; or any combination thereof. In some embodiments, the communications device only transmits at least one of the HF signal, the VHF signal, the position of origin of the HF signal, and the position of origin of the VHF signal if at least one of the HF signal and the VHF signal has: a signal-to-noise value below a set noise threshold; a frequency within a set frequency range; an amplitude above a set amplitude value; or any combination thereof. In some embodiments, the payload application further comprises an encryption module encrypting at least one of the HF signal, the VHF signal, the position of origin of the HF signal, and the position of origin of the VHF signal. In some embodiments, the vehicle communications device transmits at least one of the HF signal, the VHF signal, the position of origin of the HF signal, and the position of origin of the VHF signal by VPN, Web Socket, JSON, HTTP, HTTPS or any combination thereof. In some embodiments, the platform is capable of continuous operation for at least about 45 days without maintenance or charging.

Another aspect provided herein is a non-transitory computer-readable storage media encoded with a computer program including instructions executable by a processor to create a water-based signal interception, recording, and intelligence application comprising: a signal interception module: receiving a sensed data corresponding to the position and the orientation of an unmanned water vehicle, a High Frequency (HF) signal from a HF array, and a Very High Frequency (VHF) signal from a VHF array; and determining a position of origin of at least one of the HF signal and the VHF signal by geo-correlating at least one of the position and orientation of the unmanned water vehicle a data exfiltration module transmitting at least one of the HF signal, the VHF signal, the position of the unmanned water vehicle, and the position of origin. In some embodiments, the position comprises a GPS position, and wherein the orientation comprises a pitch angle, a roll angle, and a yaw angle. In some embodiments, at least one of the HF signal and the VHF signal comprises a signal emitted by a ship, a ground stations, or an aircraft. In some embodiments, the HF signal comprises a first spectrum of HF signals and wherein the VHF signal comprises a second spectrum of VHF signals. In some embodiments, the sensed data comprises a GPS sensed data, an accelerometer, a tilt sensed data, an inertial sensed data, a compass, a magnetic sensed data, a kinematic sensed data, or any combination thereof. In some embodiments, the signal interception module further directing a propulsion and steering system of an unmanned water vehicle to modify the position and the orientation of the unmanned water vehicle. In some embodiments, the sensed data consists of a GPS sensed data and at least one of an inertial data and a magnetic data, and wherein the navigation module directs the propulsion and steering system based on at least one of the inertial data and the magnetic data if the position of the unmanned water vehicle is within a GPS denied environment. In some embodiments, the sensed data consists of a GPS sensed data and at least one of an inertial data and a magnetic data, and wherein the signal interception module determines the position of origin of at least one of the HF signal and the VHF signal based on at least one of the inertial data and the magnetic data if the position of the unmanned water vehicle is within a GPS denied environment. In some embodiments, the signal interception module determines the position of origin of the HF signal by determining a false direction and a true direction of the HF signal from HF signals received during two or more discrete times. In some embodiments, the signal interception module determines the position of origin of the HF signal by: calculating a phase difference of the arrival of the HF signal received by the HF array; calculating a signal strength difference of the HF signal received by the HF array; or both. In some embodiments, the signal interception module determines the position of origin of the VHF signal by: calculating a phase difference of arrival of the VHF signal received by the VHF array; calculating a signal strength difference of the VHF signal received by the VHF array; or both. In some embodiments, the signal interception module further stores one or more of the HF signal, the VHF signal, and the position of origin. In some embodiments, the signal interception module only stores the position of origin of at least one of the HF signal and the VHF signal, the HF signal, or the VHF signal if at least one of the HF signal and the VHF signal has: a signal-to-noise value below a set noise threshold; a frequency within a set frequency range; an amplitude above a set amplitude value; or any combination thereof. In some embodiments, the signal interception module only transmits the position of origin of at least one of the HF signal and the VHF signal, the HF signal, or the VHF signal if at least one of the HF signal and the VHF signal has: a signal-to-noise value below a set noise threshold; a frequency within a set frequency range; an amplitude above a set amplitude value; or any combination thereof. In some embodiments, the signal interception module further encrypts the position of origin of at least one of the HF signal and the VHF signal, the HF signal, the VHF signal, or any combination thereof.

Another aspect provided herein is a computer-implemented method for water-based signal interception, recording, and intelligence comprising: receiving a sensed data corresponding to the position and the orientation of an unmanned water vehicle, a High Frequency (HF) signal from a HF array, and a Very High Frequency (VHF) signal from a VHF array; determining a position of origin of at least one of the HF signal and the VHF signal by geo-correlating at least one of the position and orientation of the unmanned water vehicle; and transmitting at least one of the HF signal, the VHF signal, the position of the unmanned water vehicle, and the position of origin.

In some embodiments, the position comprises a GPS position, and wherein the orientation comprises a pitch angle, a roll angle, and a yaw angle. In some embodiments, at least one of the HF signal and the VHF signal comprises a signal emitted by a ship, a ground stations, or an aircraft. In some embodiments, the HF signal comprises a first spectrum of HF signals and wherein the VHF signal comprises a second spectrum of VHF signals. In some embodiments, the sensed data comprises a GPS sensed data, an accelerometer, a tilt sensed data, an inertial sensed data, a compass, a magnetic sensed data, a kinematic sensed data, or any combination thereof. In some embodiments, the method further comprises directing a propulsion and steering system of an unmanned water vehicle to modify the position and the orientation of the unmanned water vehicle. In some embodiments, the sensed data consists of a GPS sensed data and at least one of an inertial data and a magnetic data, and wherein the navigation module directs the propulsion and steering system based on at least one of the inertial data and the magnetic data if the position of the unmanned water vehicle is within a GPS denied environment. In some embodiments, the sensed data consists of a GPS sensed data and at least one of an inertial data and a magnetic data, and wherein the direction finding module determines the position of origin of at least one of the HF signal and the VHF signal based on at least one of the inertial data and the magnetic data if the position of the unmanned water vehicle is within a GPS denied environment. In some embodiments, determining the position of origin of the HF signal comprises determining a false direction and a true direction of the HF signal from HF signals received during two or more discrete times In some embodiments, determining the position of origin of the HF signal comprises: calculating a phase difference of the arrival of the HF signal received by the HF array; calculating a signal strength difference of the HF signal received by the HF array, or both. In some embodiments, the direction finding module determines the position of origin of the VHF signal by: calculating a phase difference of arrival of the VHF signal received by the VHF array; calculating a signal strength difference of the VHF signal received by the VHF array, or both. In some embodiments, the method further comprises storing one or more of the HF signal, the VHF signal, and the position of origin. In some embodiments, storing the position of origin of at least one of the HF signal and the VHF signal, the HF signal, or the VHF signal only occurs if at least one of the HF signal and the VHF signal has: a signal-to-noise value below a set noise threshold; a frequency within a set frequency range; an amplitude above a set amplitude value; or any combination thereof. In some embodiments, at least one of the HF signal, the VHF signal, the position of the unmanned water vehicle, and the position of origin is transmitted if at least one of the HF signal and the VHF signal has: a signal-to-noise value below a set noise threshold; a frequency within a set frequency range; an amplitude above a set amplitude value; or any combination thereof. In some embodiments, the method further comprises encrypting the position of origin of at least one of the HF signal and the VHF signal, the HF signal, the VHF signal, or any combination thereof. In some embodiments, transmitting one or more of the position of origin of at least one of the HF signal and the VHF signal, the HF signal, and the VHF comprises transmitting by VPN, Web Socket, JSON, HTTP, HTTPS or any combination thereof.

Another aspect provided herein is a water vehicle for signal interception, recording, and intelligence comprising a physical signals interception system comprising: a first antenna array configured to receive a first frequency range; a second antenna array configured to receive a second frequency range; at least one sensor configured to measure a sensed data corresponding to a position and an orientation of the water vehicle; a vehicle communications device; and a vehicle processor configured to provide a payload application comprising: a signal interception module configured to: receive the sensed data, the first frequency range, and the second frequency range; and determining a position of origin of at least one of the first frequency range and the second frequency range by geo-correlating at least one of the position and orientation of the water vehicle; and a data exfiltration module transmitting at least one of the first frequency range, the second frequency range, the position of the water vehicle, the orientation of the water vehicle, and the position of origin via the water vehicle communications device.

In some embodiments, the water vehicle further comprises an energy storage device. In some embodiments, the energy storage device comprises a battery, a supercapacitor, a hybrid supercapacitor, a spring, or any combination thereof. In some embodiments, the at least one sensor comprises a GPS sensor. In some embodiments, the at least one sensor comprises a non-GPS sensor. In some embodiments, the non-GPS sensor comprises a compass, a sextant, a camera, an inertial sensor, or any combination thereof. In some embodiments, the orientation comprises a pitch angle, a roll angle, and a yaw angle. In some embodiments, the water vehicle further comprises an energy harvesting device. In some embodiments, the energy harvesting device comprises a solar panel a wind turbine, a kite, a buoy, or any combination thereof. In some embodiments, at least one of the first frequency range and the second frequency range comprises a signal emitted by a ship, a ground stations, or an aircraft. In some embodiments, the first frequency range comprises a first spectrum of first frequency ranges and wherein the second frequency range comprises a second spectrum of second frequency ranges. In some embodiments, the first antenna array comprises two first antennas separated by a baseline distance. In some embodiments, the baseline distance is about 2.5 meters to about 25 meters. In some embodiments, the second antenna array comprises a circular array of second antennas, a rectilinear array of second antennas, or a phased array of second antennas. In some embodiments, the circular second antenna array has a diameter of about 0.2 meters to about 1 meter. In some embodiments, the second antenna array further comprises a counterpoise second antenna. In some embodiments, the second antenna array comprises four counterpoise second antennas and wherein each counterpoise second antenna is generally coaxial with one second antenna. In some embodiments, the water vehicle further comprises a stanchion, and wherein at least one of the first antenna array and the second antenna array is attached to the stanchion. In some embodiments, the stanchion has a height of about 0.8 meters to about 8 meters. In some embodiments, the reception area of at least one of the first antenna array and the second antenna array is at least about 5 kilometers. In some embodiments, the reception area of at least one of the first antenna array and the second antenna array is about 5 kilometers to about 200 kilometers. In some embodiments, the sensor comprises a GPS sensor configured to measure a GPS data, an accelerometer configured to measure an acceleration data, a tilt sensor configured to measure a tilt data, an inertial sensor configured to measure an inertial data, a compass configured to measure a heading, a potentiometer configured to measure an angle, an Automatic Identification System (AIS) sensor configured to measure an AIS data, or any combination thereof. In some embodiments, the sensor consists of a GPS sensor and at least one of the inertial sensor, the magnetic, and (C), the AIS sensor, and wherein the signal interception module determines the position of origin of at least one of the first frequency range and the second frequency range based on at least one of the inertial data and the magnetic data if the position of the water vehicle is within a GPS denied environment. In some embodiments, vehicle communications device comprises a satellite communication device, a Wi-Fi communication device, an RFID communication device, a Bluetooth communication device, a mesh network communication device, an over-the-horizon communication device, or any combination thereof. In some embodiments, the vehicle communications device consists of the Wi-Fi communication device and wherein the Wi-Fi communication device is only enabled for local diagnostics. In some embodiments, the water vehicle further comprises a propulsion and steering system configured to modify the position and the orientation of the water vehicle. In some embodiments, the propulsion and steering system comprises a motor, a wave glider, a rudder, a propeller, an anchor, a sail, a kite, a jet, or any combination thereof. In some embodiments, the signal interception module determines the position of origin of the first frequency range by: determining a false direction or a true direction of the first frequency range; and directing the propulsion and steering system to modify the position, the orientation, or both of the water vehicle until a true direction of the first frequency range is determined. In some embodiments, the signal interception module determines the position of origin of the first frequency range by: calculating a phase difference of the arrival of the first frequency range received by the first antenna array; calculating a signal strength difference of the first frequency range received by the first antenna array; or both. In some embodiments, the direction finding module determines the position of origin of the second frequency range by: calculating a phase difference of arrival of the second frequency range received by the second antenna array; calculating a signal strength difference of the second frequency range received by the second antenna array; or both. In some embodiments, the payload application further comprises a memory module storing one or more of the first frequency range, the second frequency range, the position of origin of the first frequency range, and the position of origin of the second frequency range. In some embodiments, the memory module only stores at least one of the first frequency range, the second frequency range, the position of origin of the first frequency range, and the position of origin of the second frequency range if at least one of the first frequency range and the second frequency range has: a signal-to-noise value below a set noise threshold; a frequency within a set frequency range; an amplitude above a set amplitude value; or any combination thereof. In some embodiments, the communications device only transmits at least one of the first frequency range, the second frequency range, the position of origin of the first frequency range, and the position of origin of the second frequency range if at least one of the first frequency range and the second frequency range has: a signal-to-noise value below a set noise threshold; a frequency within a set frequency range; an amplitude above a set amplitude value; or any combination thereof. In some embodiments, the payload application further comprises an encryption module encrypting at least one of the first frequency range, the second frequency range, the position of origin of the first frequency range, and the position of origin of the second frequency range. In some embodiments, the vehicle communications device transmits at least one of the first frequency range, the second frequency range, the position of origin of the first frequency range, and the position of origin of the second frequency range by VPN, Web Socket, JSON, HTTP, HTTPS or any combination thereof. In some embodiments, the water vehicle is capable of continuous operation for at least 45 days without maintenance or charging.

Another aspect provided herein is a water-based signal interception, recording, and intelligence platform comprising: a water vehicle comprising: a first antenna array configured to receive a first frequency range; a second antenna array configured to receive a second frequency range; at least one sensor configured to measure a sensed data corresponding to the position and the orientation of the water vehicle; a vehicle communications device; and a vehicle processor configured to provide a payload application comprising: a signal interception module configured to: receive the sensed data, the first frequency range, and the second frequency range; and determining a position of origin of at least one of the first frequency range and the second frequency range by geo-correlating at least one of the position and orientation of the water vehicle; and a data exfiltration module transmitting at least one of the first frequency range, the second frequency range, the position of the water vehicle, the orientation of the water vehicle, and the position of origin via the water vehicle communications device; and a control station comprising a control station processor configured to provide a shoreside application comprising a communication module receiving the position of origin and at least one of the position and orientation of the water vehicle. In some embodiments, the water vehicle further comprises an energy storage device. In some embodiments, the energy storage device comprises a battery, a supercapacitor, a hybrid supercapacitor, a spring, or any combination thereof. In some embodiments, the position comprises a GPS position. In some embodiments, the orientation comprises a pitch angle, a roll angle, and a yaw angle. In some embodiments, the water vehicle further comprises an energy harvesting device. In some embodiments, the energy harvesting device comprises a solar panel a wind turbine, a kite, a buoy, or any combination thereof. In some embodiments, at least one of the first frequency range and the second frequency range comprises a signal emitted by a ship, a ground stations, or an aircraft. In some embodiments, the first frequency range comprises a first spectrum of first frequency ranges and wherein the second frequency range comprises a second spectrum of second frequency ranges. In some embodiments, the first antenna array comprises two first antennas separated by a baseline distance. In some embodiments, the baseline distance is 2.5 meters to about 25 meters. In some embodiments, the second antenna array comprises a circular array of four second antennas. In some embodiments, the circular second antenna array has a diameter of about 0.2 meters to about 1 meter. In some embodiments, the second antenna array comprises a counterpoise second antenna. In some embodiments, the second antenna array comprises four counterpoise second antennas and wherein each counterpoise second antenna is generally coaxial with one second antenna. In some embodiments, the water vehicle further comprises a stanchion, and wherein at least one of the first antenna array and the second antenna array is attached to the stanchion. In some embodiments, the stanchion has a height of about 0.8 meters to about 8 meters. In some embodiments, the reception area of at least one of the first antenna array and the second antenna array is at least about 5 kilometers. In some embodiments, the reception area of at least one of the first antenna array and the second antenna array is about 5 kilometers to about 200 kilometers. In some embodiments, the sensor comprises a GPS sensor, an accelerometer, a tilt sensor, an inertial sensor, a compass, a magnetic sensor, a kinematic sensor, or any combination thereof. In some embodiments, the sensor consists of a GPS sensor and at least one of (A) an inertial sensor configured to measure an inertial data and (B) a magnetic sensor configured to measure a magnetic data, and wherein the signal interception module determines the position of origin of at least one of the first frequency range and the second frequency range based on at least one of the inertial data and the magnetic data if the position of the platform is within a GPS denied environment. In some embodiments, vehicle communications device comprises a satellite communication device, a Wi-Fi communication device, an RFID communication device, a Bluetooth communication device, a mesh network communication device, an over-the-horizon communication device, or any combination thereof. In some embodiments, the vehicle communications device consists of the Wi-Fi communication device, and wherein the Wi-Fi communication device is only enabled for local diagnostics. In some embodiments, the water vehicle further comprises a propulsion and steering system configured to modify the position and the orientation of the platform. In some embodiments, the propulsion and steering system comprises a motor, a wave glider, a rudder, a propeller, an anchor, a sail, a kite, a jet, or any combination thereof. In some embodiments, the signal interception module determines the position of origin of the first frequency range by: determining a false direction or a true direction of the first frequency range; and directing the propulsion and steering system to modify the position, the orientation, or both, of the platform until a true direction of the first frequency range is determined. In some embodiments, the signal interception module determines the position of origin of the first frequency range by: calculating a phase difference of the arrival of the first frequency range received by the first antenna array; calculating a signal strength difference of the first frequency range received by the first antenna array; or both. In some embodiments, the direction finding module determines the position of origin of the second frequency range by: calculating a phase difference of arrival of the second frequency range received by the second antenna array; calculating a signal strength difference of the second frequency range received by the second antenna array; or both. In some embodiments, the payload application further comprises a memory module storing one or more of the first frequency range, the second frequency range, the position of origin of the first frequency range, and the position of origin of the second frequency range. In some embodiments, the memory module only stores at least one of the first frequency range, the second frequency range, the position of origin of the first frequency range, and the position of origin of the second frequency range if at least one of the first frequency range and the second frequency range has: a signal-to-noise value below a set noise threshold; a frequency within a set frequency range; an amplitude above a set amplitude value; or any combination thereof. In some embodiments, the communications device only transmits at least one of the first frequency range, the second frequency range, the position of origin of the first frequency range, and the position of origin of the second frequency range if at least one of the first frequency range and the second frequency range has: a signal-to-noise value below a set noise threshold; a frequency within a set frequency range; an amplitude above a set amplitude value; or any combination thereof. In some embodiments, the payload application further comprises an encryption module encrypting at least one of the first frequency range, the second frequency range, the position of origin of the first frequency range, and the position of origin of the second frequency range. In some embodiments, the vehicle communications device transmits at least one of the first frequency range, the second frequency range, the position of origin of the first frequency range, and the position of origin of the second frequency range by VPN, Web Socket, JSON, HTTP, HTTPS or any combination thereof. In some embodiments, the platform is capable of continuous operation for at least 45 days without maintenance or charging.

Another aspect provided herein is a non-transitory computer-readable storage media encoded with a computer program including instructions executable by a processor to create a water-based signal interception, recording, and intelligence application comprising: a signal interception module: receiving a sensed data corresponding to the position and the orientation of a water vehicle, a first signal from a first antenna array, and a second signal from a second antenna array; and determining a position of origin of at least one of the first frequency range and the second frequency range by geo-correlating at least one of the position and orientation of the water vehicle a data exfiltration module transmitting at least one of the first frequency range, the second frequency range, the position of the water vehicle, and the position of origin.

In some embodiments, the position comprises a GPS position, and wherein the orientation comprises a pitch angle, a roll angle, and a yaw angle. In some embodiments, at least one of the first frequency range and the second frequency range comprises a signal emitted by a ship, a ground stations, or an aircraft. In some embodiments, the first frequency range comprises a first spectrum of first frequency ranges and wherein the second frequency range comprises a second spectrum of second frequency ranges. In some embodiments, the signal interception module further directing a propulsion and steering system of a water vehicle to modify the position and the orientation of the water vehicle. In some embodiments, the sensed data comprises a GPS sensed data, an accelerometer, a tilt sensed data, an inertial sensed data, a compass, a magnetic sensed data, a kinematic sensed data, or any combination thereof. In some embodiments, the sensed data consists of a GPS sensed data and at least one of an inertial data and a magnetic data, and wherein the navigation module directs the propulsion and steering system based on at least one of the inertial data and the magnetic data if the position of the water vehicle is within a GPS denied environment. In some embodiments, the sensed data consists of a GPS sensed data and at least one of an inertial data and a magnetic data, and wherein the signal interception module determines the position of origin of at least one of the first frequency range and the second frequency range based on at least one of the inertial data and the magnetic data if the position of the water vehicle is within a GPS denied environment. In some embodiments, the signal interception module determines the position of origin of the first frequency range by: determining a false direction or a true direction of the first frequency range; and directing the propulsion and steering system to modify the position, the orientation, or both, of the water vehicle until a true direction of the first frequency range is determined. In some embodiments, the signal interception module determines the position of origin of the first frequency range by: calculating a phase difference of the arrival of the first frequency range received by the first antenna array; calculating a signal strength difference of the first frequency range received by the first antenna array; or both. In some embodiments, the signal interception module determines the position of origin of the second frequency range by: calculating a phase difference of arrival of the second frequency range received by the second antenna array; calculating a signal strength difference of the second frequency range received by the second antenna array; or both. In some embodiments, the signal interception module further stores one or more of the first frequency range, the second frequency range, and the position of origin. In some embodiments, the signal interception module only stores the position of origin of at least one of the first frequency range and the second frequency range, the first frequency range, or the second frequency range if at least one of the first frequency range and the second frequency range has: a signal-to-noise value below a set noise threshold; a frequency within a set frequency range; an amplitude above a set amplitude value; or any combination thereof. In some embodiments, the signal interception module only transmits the position of origin of at least one of the first frequency range and the second frequency range, the first frequency range, or the second frequency range if at least one of the first frequency range and the second frequency range has: a signal-to-noise value below a set noise threshold; a frequency within a set frequency range; an amplitude above a set amplitude value; or any combination thereof. In some embodiments, the signal interception module further encrypts the position of origin of at least one of the first frequency range and the second frequency range, the first frequency range, the second frequency range, or any combination thereof.

Another aspect provided herein is a computer-implemented method for water-based signal interception, recording, and intelligence comprising: receiving a sensed data corresponding to the position and the orientation of a water vehicle, a first signal from a first antenna array, and a second signal from a second antenna array; determining a position of origin of at least one of the first frequency range and the second frequency range by geo-correlating at least one of the position and orientation of the water vehicle; and transmitting at least one of the first frequency range, the second frequency range, the position of the water vehicle, and the position of origin. The method of claim 188, wherein the position comprises a GPS position, and wherein the orientation comprises a pitch angle, a roll angle, and a yaw angle. In some embodiments, at least one of the first frequency range and the second frequency range comprises a signal emitted by a ship, a ground stations, or an aircraft. In some embodiments, the first frequency range comprises a first spectrum of first frequency ranges and wherein the second frequency range comprises a second spectrum of second frequency ranges. In some embodiments, the method further comprises directing a propulsion and steering system of a water vehicle to modify the position and the orientation of the water vehicle. In some embodiments, the sensed data comprises a GPS sensed data, an accelerometer, a tilt sensed data, an inertial sensed data, a compass, a magnetic sensed data, a kinematic sensed data, or any combination thereof. In some embodiments, the sensed data consists of a GPS sensed data and at least one of an inertial data and a magnetic data, and wherein the navigation module directs the propulsion and steering system based on at least one of the inertial data and the magnetic data if the position of the water vehicle is within a GPS denied environment. In some embodiments, the sensed data consists of a GPS sensed data and at least one of an inertial data and a magnetic data, and wherein the direction finding module determines the position of origin of at least one of the first frequency range and the second frequency range based on at least one of the inertial data and the magnetic data if the position of the water vehicle is within a GPS denied environment. In some embodiments, determining the position of origin of the first frequency range comprises: determining a false direction or a true direction of the first frequency range; and directing the propulsion and steering system to modify the position, the orientation, or both, of the water vehicle until a true direction of the first frequency range is determined. In some embodiments, determining the position of origin of the first frequency range comprises: calculating a phase difference of the arrival of the first frequency range received by the first antenna array; calculating a signal strength difference of the first frequency range received by the first antenna array; or both. In some embodiments, the direction finding module determines the position of origin of the second frequency range by: calculating a phase difference of arrival of the second frequency range received by the second antenna array; calculating a signal strength difference of the second frequency range received by the second antenna array; or both. In some embodiments, the method further comprises storing one or more of the first frequency range, the second frequency range, and the position of origin. In some embodiments, storing the position of origin of at least one of the first frequency range and the second frequency range, the first frequency range, or the second frequency range only occurs if at least one of the first frequency range and the second frequency range has: a signal-to-noise value below a set noise threshold; a frequency within a set frequency range; an amplitude above a set amplitude value; or any combination thereof. In some embodiments, at least one of the first frequency range, the second frequency range, the position of the water vehicle, and the position of origin is transmitted if at least one of the first frequency range and the second frequency range has: a signal-to-noise value below a set noise threshold; a frequency within a set frequency range; an amplitude above a set amplitude value; or any combination thereof. In some embodiments, the method further comprises encrypting the position of origin of at least one of the first frequency range and the second frequency range, the first frequency range, the second frequency range, or any combination thereof. In some embodiments, transmitting one or more of the position of origin of at least one of the first frequency range and the second frequency range, the first frequency range comprises transmitting by VPN, WebSocket, JSON, HTTP, HTTPS or any combination thereof.

Other goals and advantages of the present subject matter will be further appreciated and understood when considered in conjunction with the following description and accompanying drawings. While the following description may contain specific details describing particular embodiments of the present subject matter, this should not be construed as limitations to the scope of the subject matter but rather as an exemplification of preferable embodiments. For each aspect of the present subject matter, many variations are possible as suggested herein that are known to those of ordinary skill in the art. A variety of changes and modifications may be made within the scope of the present disclosure without departing from the spirit thereof.

BRIEF DESCRIPTION OF THE DRAWINGS

The novel features of the present subject matter are set forth with particularity in the appended claims. A better understanding of the features and advantages of the present subject matter will be obtained by reference to the following detailed description that sets forth illustrative embodiments, in which the principles of the present subject matter are utilized, and the accompanying drawings of which:

DETAILED DESCRIPTION

Although many angle of arrival systems and algorithms enable localization of collected signals, such systems are configured for use on fixed platforms where the instant origin and orientation of the sensor system is known and generally permanent. As such, these systems are incapable of accurate collection and measurement at sea and aboard unstable platforms.

As such, provided herein are water vehicles, platforms, and media for stealthy, low-power, and long range electronic warfare and signals intelligence. The water vehicles, platforms, and media herein are capable of capturing communication between ships, land and air and ground stations across multiple spectrum, and transmitting real-time disambiguated transmission recordings and source positions.

While preferred embodiments of the present subject matter have been shown and described herein, it will be obvious to those skilled in the art that such embodiments are provided by way of example only. Numerous variations, changes, and substitutions will now occur to those skilled in the art without departing from the present disclosure. It should be understood that various alternatives to the embodiments of the subject matter described herein may be employed in practice. It is intended that the following claims define the scope of the present subject matter and that methods and structures within the scope of these claims and their equivalents be covered thereby.

Water Vehicle for Signal Interception, Recording, and Intelligence

Figure 1:
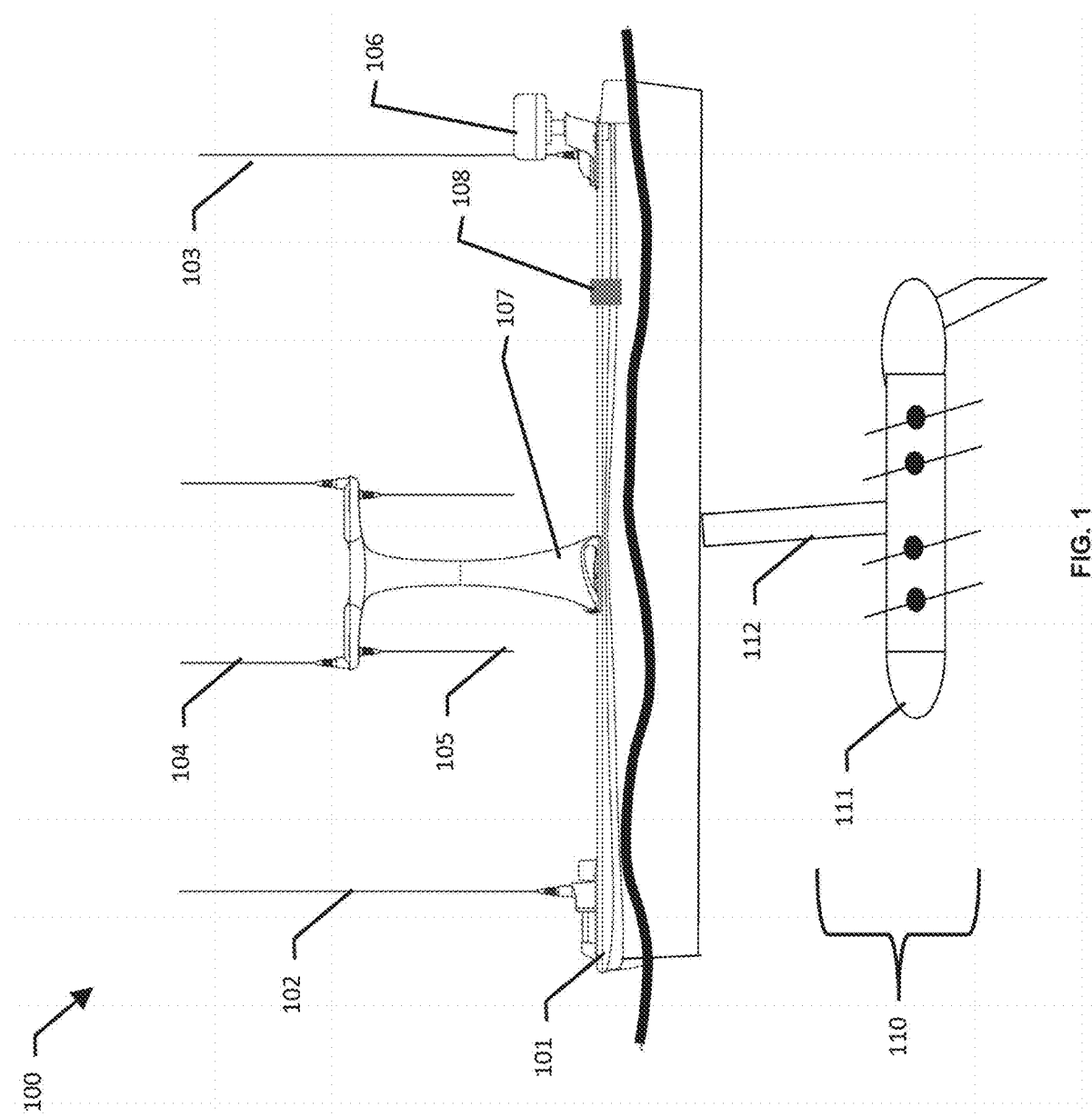
FIG. 1 shows a side schematic diagram of the above and below-water components of an exemplary unmanned water vehicle for signal interception, recording, and intelligence, in accordance with an embodiment herein.
Figure 5:
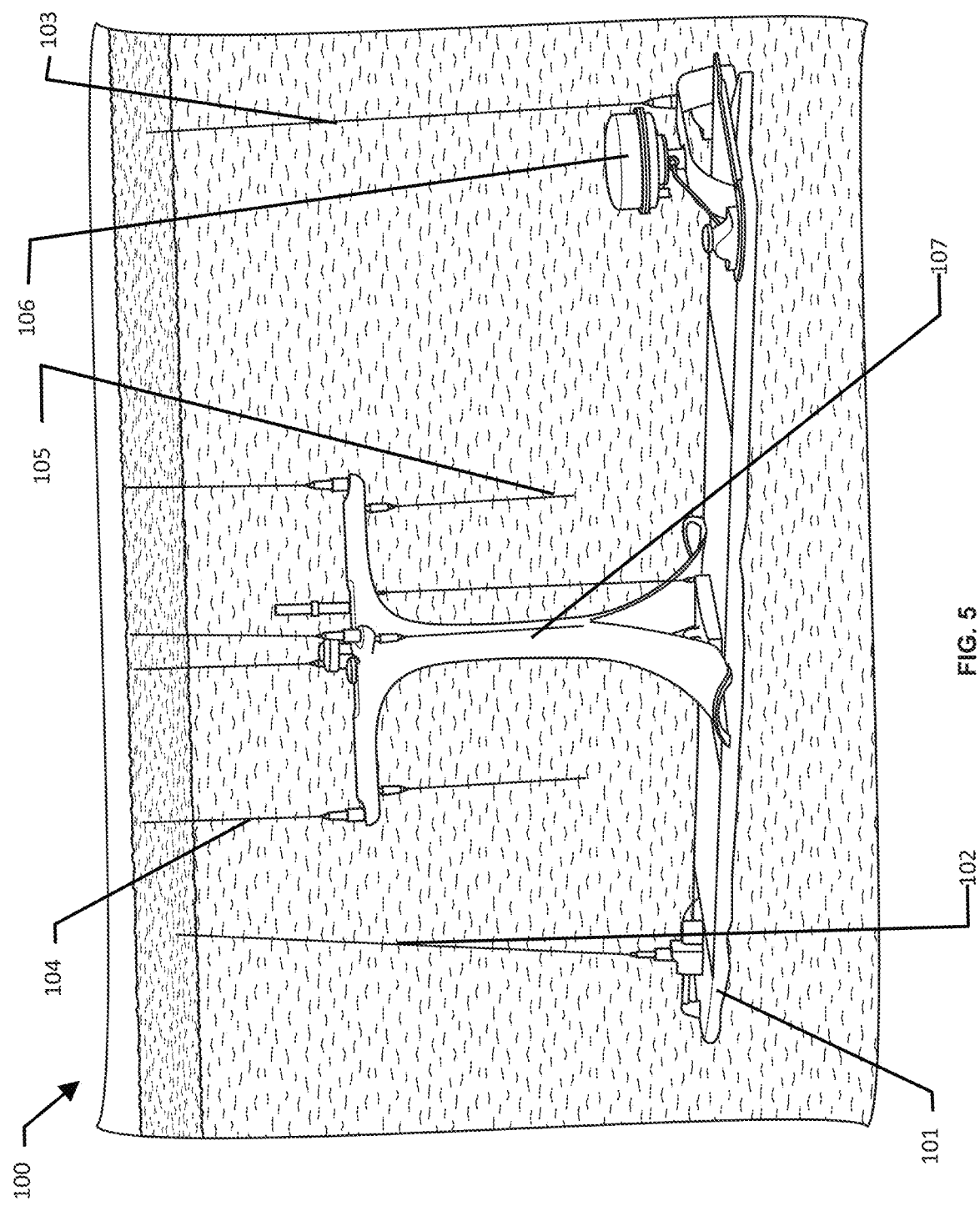
FIG. 5 shows a side perspective image of the above-water components of an exemplary unmanned water vehicle for signal interception, recording, and intelligence, in accordance with an embodiment herein.
Figure 6:
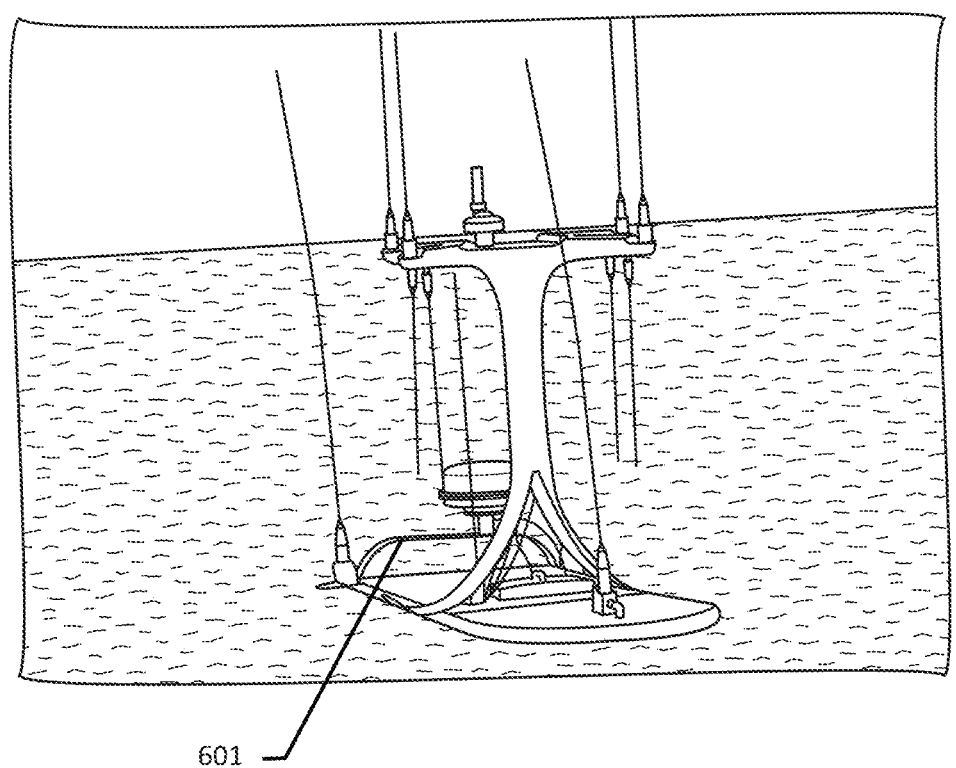
FIG. 6 shows a front perspective image of the above-water components of an exemplary unmanned water vehicle for signal interception, recording, and intelligence, in accordance with an embodiment herein.
Figure 7:
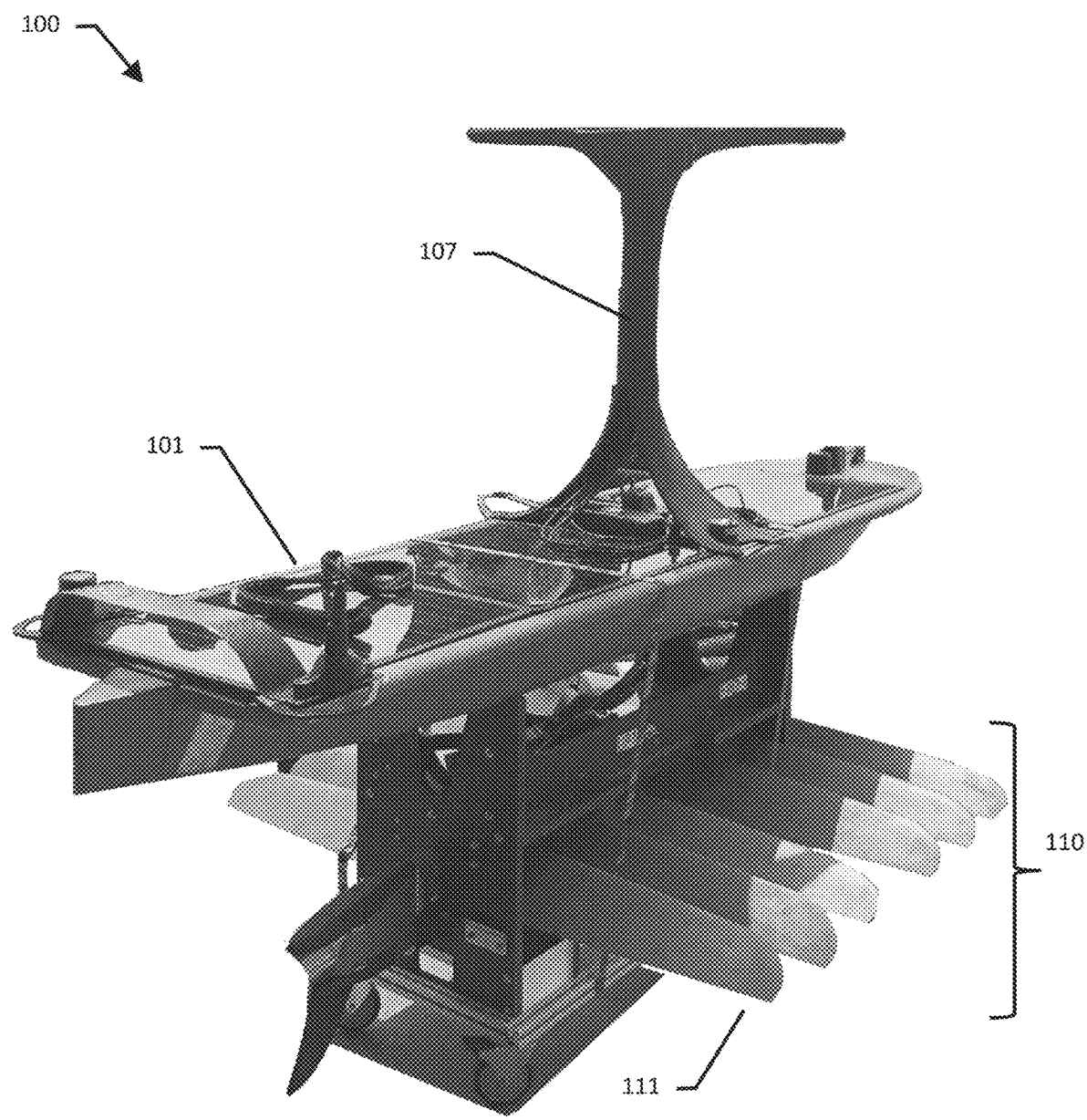
FIG. 7 shows a side perspective image of an exemplary unmanned water vehicle for signal interception, recording, and intelligence on a trailer and out of the water, in accordance with an embodiment herein.

Provided herein, per FIGS. 1-7, is a water vehicle 100 for signal interception, recording, and intelligence 100. FIGS. 2-6 show non-limiting depictions of the above-water components of an exemplary water vehicle 100, whereas FIGS. 1 and 7 show only the below and above-water components of the exemplary water vehicle 100. The water vehicle 100 may comprise a physical signals interception system, at least one sensor 108, a vehicle communications device 106, and a vehicle processor. In some embodiments, the water vehicle 100 is a surface vehicle. The water vehicle 100 may be unmanned, autonomous, remotely steerable or any combination thereof. In some embodiments, the water vehicle 100 consists of an unmanned water vehicle 100.

In some embodiments, the water vehicle 100 comprises a ship, boat, a raft, or any combination thereof. A hull 101 of the water vehicle 100 may comprise a planning hull, a pontoon hull, or a displacement hull. At least one of the planning hull, a pontoon hull, or a displacement hull may comprise a round-bottom hull a flat-bottom hull, a deep 'V' bottom hull, a multi-chine hull, or a multi-hull. In some embodiments, the water vehicle 100 is capable of long endurance and continuous operation for at least 45 days without maintenance or charging.

FIGS. 5-6 show perspective images of the above-water components of an exemplary water vehicle 100 for signal interception, recording, and intelligence. FIG. 7 shows a side perspective image of an exemplary water vehicle 100 for signal interception, recording, and intelligence on a trailer and out of the water. As seen therein, the buoyancy of the water vehicle 100 forms a stable (and level where water conditions allow) platform during locomotion or rest. Further, as shown, the satellite antenna 106 may comprise a mount for elevation above the water level.

In some embodiments, the water vehicle 100 further comprises a stanchion 107. The stanchion 107 may support at least a portion of the physical signals interception system. The stanchion 107 may support the HF array, the VHF array, or both. In some embodiments, the stanchion 107 has a height of about 0.8 meters to about 8 meters. The height of the stanchion 107 may dictate the range of the physical signals interception system. Particularly, the height of the stanchion 107 may dictate the line-of-sight range or region of interest of the VHF antenna array, as VHF signals cannot travel over the horizon.

In some embodiments, the water vehicle 100 further comprises an energy storage device. The energy storage device may comprise a battery, a supercapacitor, a hybrid supercapacitor, a spring, or any combination thereof. In some embodiments, the water vehicle 100 further comprises an energy harvesting device. The energy harvesting device may comprise a solar panel a wind turbine, a kite, a buoy, or any combination thereof. In some embodiments, the energy storage device, the energy harvesting device, or both enables continuous operation of the water vehicle 100 for at least 45 days without maintenance or charging. In some embodiments, the water vehicle 100 receives energy from only the battery and the energy harvesting device during operation.

Propulsion and Steering System

In some embodiments, the water vehicle 100 further comprises a propulsion and steering system 110. The propulsion and steering system 110 may be configured to modify the position, the orientation of the water vehicle 100, or both. The propulsion and steering system 110 may comprise a low-power-input system that requires little to no stored or harvested energy to propel the water vehicle 100.

The propulsion and steering system 110 may comprise a motor, a wave glider 111, a rudder, a propeller, an anchor, a sail, a kite, a jet, or any combination thereof. The propulsion and steering system may comprise one or more of a motor, a wave glider 111, a rudder, a propeller, an anchor, a sail, a kite, a jet, or any combination thereof. In a particular embodiment, per FIG. 7, the propulsion and steering system comprises a Liquid Robotics Wave Glider® 111. In some embodiments, the propulsion and steering system 110 by a boom arm 112. In some embodiments, the propulsion and steering system 110 by two or more boom arms 112. In some embodiments, the boom arm 112 is coupled to the propulsion and steering system 110 by a rigid linkage, a 1 degree-of-freedom linkage, or a 2 degree-of-freedom linkage. In some embodiments, the boom arm 112 is coupled to the water vehicle 100 by a rigid linkage, a 1 degree-of-freedom linkage, or a 2 degree-of-freedom linkage. In some embodiments, the propulsion and steering system 110 further comprises a thrudder. A thrudder, also termed auxiliary vectored thruster, is an engine or motor capable of manipulating its direction of thrust to control the attitude or angular velocity of the water vehicle 100.

Physical Signals Interception System

Per FIGS. 1-7, the physical signals interception system may comprise a High Frequency (HF) antenna array, a Very High Frequency (VHF) antenna array, and a satellite antenna 106. The physical signals interception system may comprise 1, 2, 3, 4, 5, 6, 7, 9, 10 or more HF antenna arrays, 1, 2, 3, 4, 5, 6, 7, 9, 10 or more VHF antenna arrays, and 1, 2, 3, 4, 5, 6, 7, 9, 10 or more satellite antennas 106. The HF antenna array may comprise 1, 2, 3, 4, 5, 6, 7, 9, 10 or more HF antennas 102 103. The HF antenna array may comprise a HF bow antenna 102 and a HF stern antenna 103. The VHF antenna array may comprise 1, 2, 3, 4, 5, 6, 7, 9, 10 or more VHF antennas 104 105. The VHF antenna array may comprise a VHF antenna 104, and a VHF counterpoise antenna 105.

The HF antenna array may comprise a first antenna array configured to receive a first frequency range. The VHF antenna array may comprise a second antenna array configured to receive a second frequency range. The first frequency range may be about 3 megahertz (MHz) to about 30 MHz. The first frequency range may comprise a decameter band or decameter wave. The first frequency range may comprise wavelengths from about 1 decameter to about 10 decameters. The second frequency range may be about 30 megahertz (MHz) to about 300 MHz.

In one particular embodiment, as shown in FIGS. 1-7, the water vehicle 100 comprises one HF bow antenna 102, one HF stern antenna 103, four VHF antennas 104, four VHF counterpoise antennas 105, and one satellite antenna 106. Each of the four VHF antennas 104 may be generally aligned, opposing or both with respect to one of the four VHF counterpoise antennas 105. Per FIG. 3, the VHF antennas 104, the VHF counterpoise antennas 105, or both may be arranged in a rectilinear array or a circular array. The rectilinear array may be parallel to a direction between the bow and the stern of the water vehicle 100. Alternatively, the rectilinear array may be askew from the direction between the bow and the stern of the water vehicle 100. Further, the VHF counterpoise antennas 105, or both may be arranged in a phased array.

Figure 3:
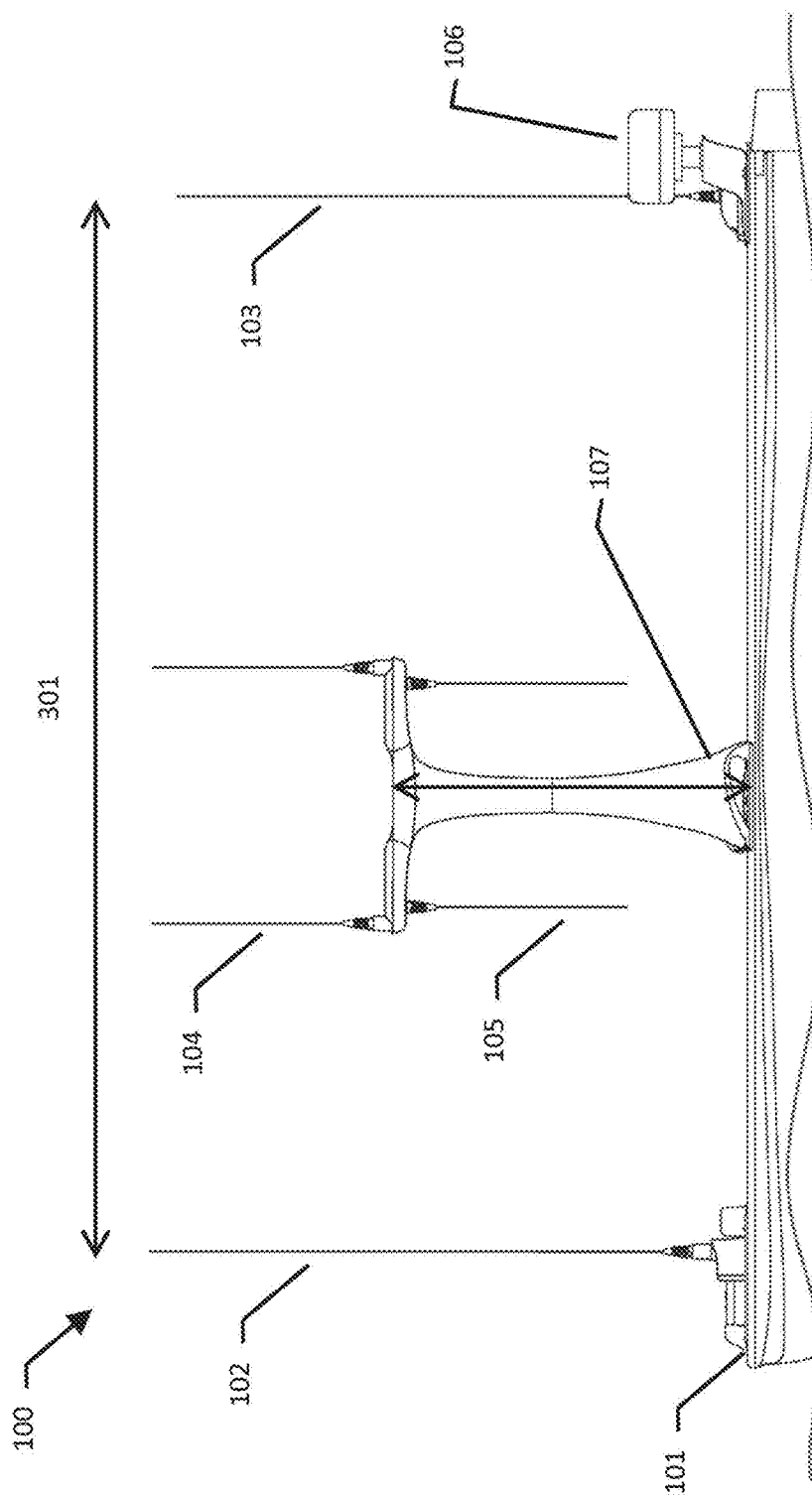
FIG. 3 shows a side schematic diagram of an exemplary unmanned water vehicle for signal interception, recording, and intelligence, in accordance with an embodiment herein.

Per FIG. 3, the HF bow antenna 102 and the HF stern antenna 103 may be separated by an HF baseline distance 301. The HF baseline distance 301 may be about 2.5 meters to about 25 meters. The HF baseline distance 301 may be at least about 2.5 meters. The HF baseline distance 301 determines the direction finding performance of the water vehicle 100, whereas a higher HF baseline distance 301 increases the direction finding performance. The HF baseline distance 301 may be optimized to capture a specific wavelength, or a specific range of wavelengths. The HF baseline distance 301 may equal to one quarter of the specific wavelength or the median of the specific range of wavelengths.

Figure 4:
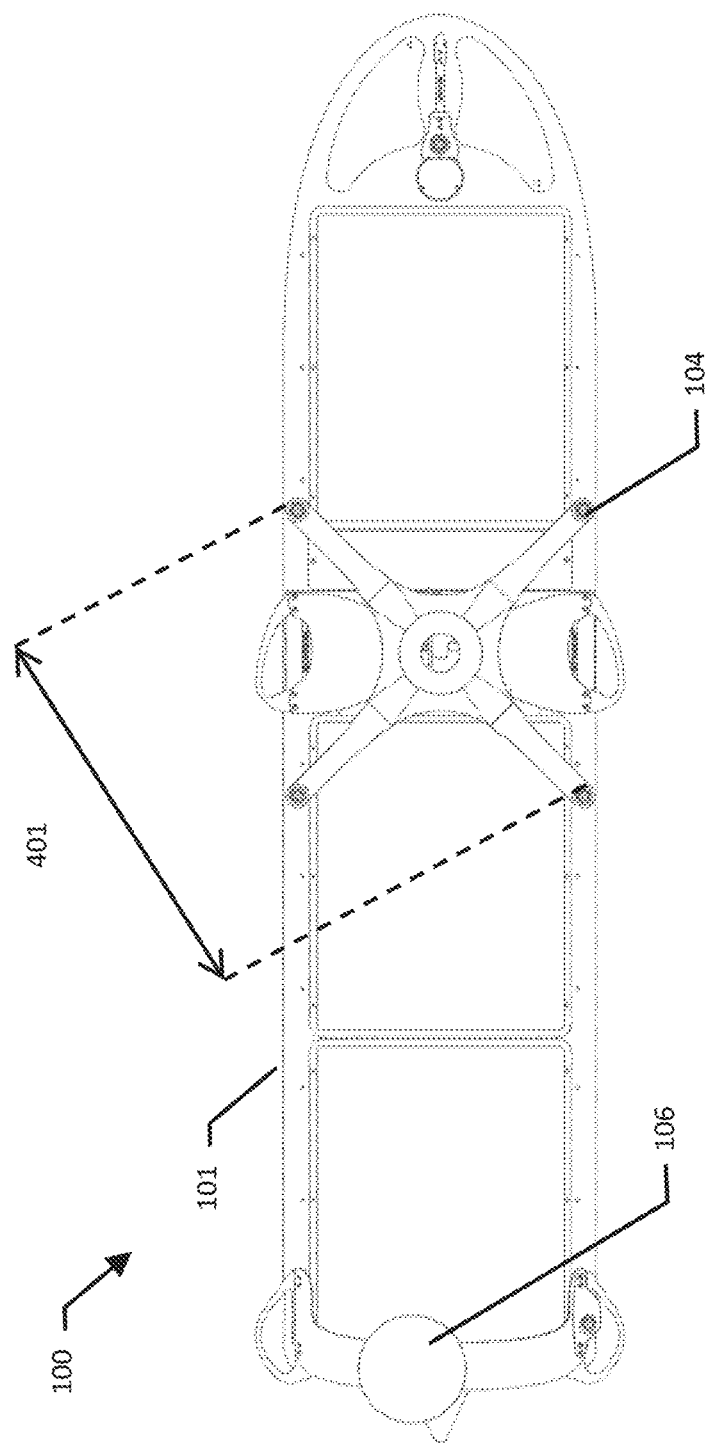
FIG. 4 shows a top schematic diagram of an exemplary unmanned water vehicle for signal interception, recording, and intelligence, in accordance with an embodiment herein.

As seen in FIG. 4, opposing VHF antennas 104 or VHF counterpoise antennas 105 (for example, the bow-port antenna and the stern-starboard antenna) may be separated by a VHF baseline distance 401. The VHF baseline distance 401 may be about 0.2 meters to about 1 meter. The VHF baseline distance 401 may be at least about 0.2 meters. The VHF baseline distance 401 determines the direction finding performance of the water vehicle 100, whereas a higher VHF baseline distance 401 increases the direction finding performance. The VHF baseline distance 401 may be optimized to capture a specific wavelength, or a specific range of wavelengths. The VHF baseline distance 401 and the HF baseline distance 201 may be concurrently optimized to capture a specific wavelength, or a specific range of wavelengths The VHF baseline distance 401 may equal to one quarter of the specific wavelength or the median of the specific range of wavelengths.

At least one of the HF antenna array and the VHF antenna array may be configured for passive signal phase detection, active passive signal phase detection, antenna grid detection, electronic scanning detection, non-visual frequency detection, or any combination thereof. The HF antenna array may be configured to receive a HF signal. The VHF antenna array may be configured to receive a VHF signal. In some embodiments, at least one of the HF signal and the VHF signal comprises a signal emitted by a ship, a ground stations, or an aircraft. In some embodiments, the HF signal comprises a first spectrum of HF signals and wherein the VHF signal comprises a second spectrum of VHF signals. The water vehicle 100 may comprise two or more types or configurations of the HF bow antenna 102, the HF stern antenna 103, the VHF antenna 104, the VHF counterpoise antenna 105, and the satellite antenna 106. At least one of the HF bow antenna 102, the HF stern antenna 103, the VHF antenna 104, the VHF counterpoise antenna 105, and the satellite antenna 106 may comprise a dipole antenna.

Figure 2:
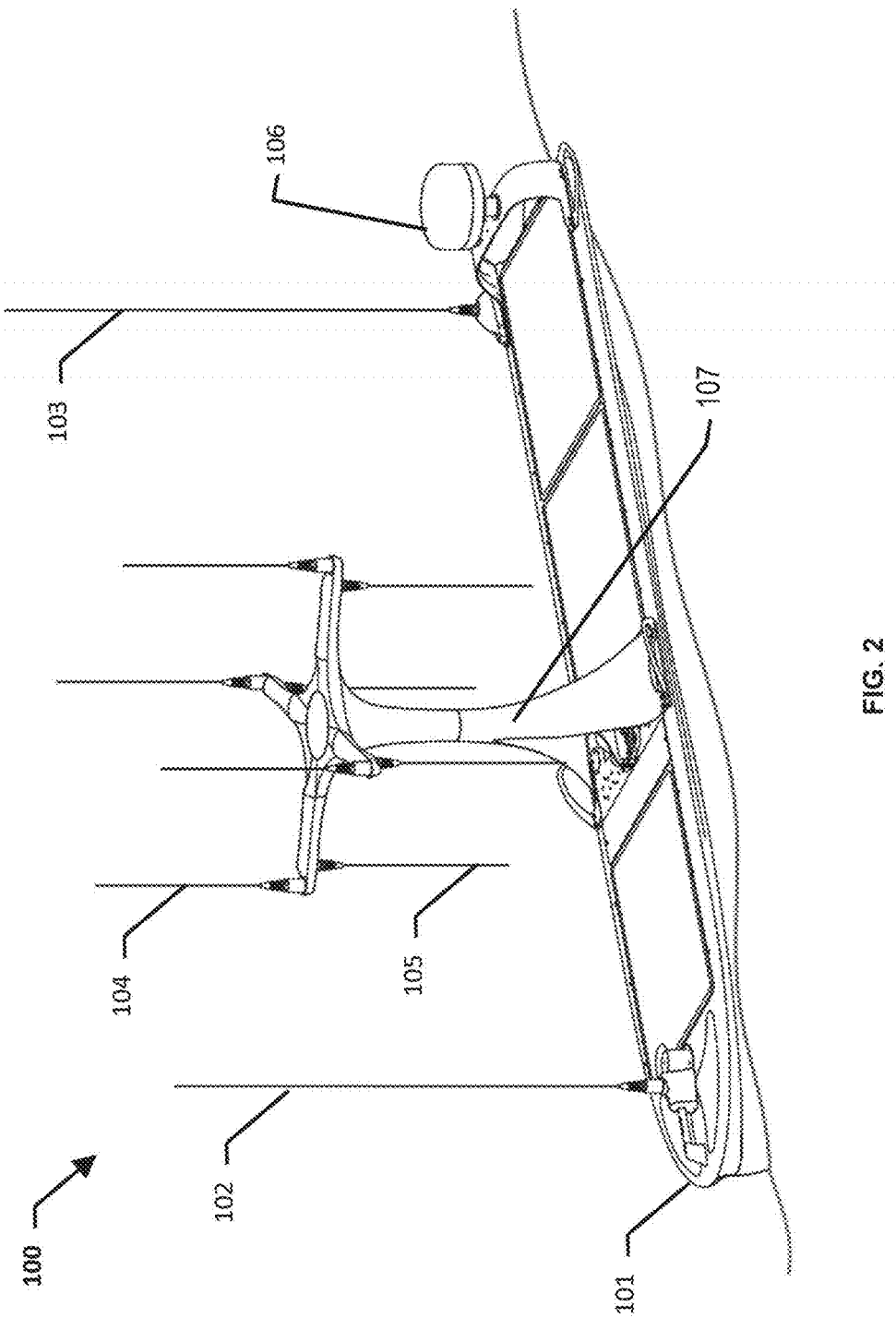
FIG. 2 shows a side perspective schematic diagram of an exemplary unmanned water vehicle for signal interception, recording, and intelligence, in accordance with an embodiment herein.

Per FIGS. 1, 2, and 14, the at least one of the HF bow antenna 102, the HF stern antenna 103, the VHF antenna 104, the VHF counterpoise antenna 105, and the satellite antenna 106 may be positioned on a stanchion 107 of the water vehicle 100. As shown, the VHF antenna 104, and the VHF counterpoise antenna 105 may be positioned on the stanchion 107. As shown, the VHF antenna 104, and the VHF counterpoise antenna 105 may be positioned on the stanchion 107 to allow clearance for the downwards facing VHF counterpoise antenna 105. Alternatively, one or more of the HF bow antenna 102, the HF stern antenna 103, the VHF antenna 104, the VHF counterpoise antenna 105, and the satellite antenna 106 may comprise a mount, a stand, or both to connect to the water vehicle 100. FIG. 6 shows an image of an exemplary mount 601 for the satellite antenna 106. The mount or stand may prevent water damage and vibrational interference. The mount may alternatively or additionally absorb vibrations or sway. At least a portion of the HF array, the VHF array, and the satellite antenna 106, or any combination thereof may be interconnected by one or more cables. The cables may comprise a coaxial cable.

In some embodiments, the physical signals interception system has a reception area of about 5 kilometers. In some embodiments, the physical signals interception system has a reception area of about 5 kilometers to about 200 kilometers. In some embodiments at least one of the HF array and the VHF array has a reception area of at least about 5 kilometers. In some embodiments, the reception area of at least one of the HF array and the VHF array is about 5 kilometers to about 1,600 kilometers.

Sensors

The sensor 108 may be configured to measure a sensed data. The sensor 108 may comprise 1, 2, 3, 4, 5, 6, 7, 8, 9, 10, or more sensors. The sensor 108 may comprise two or more types of sensors configured to measure two or more sensed data phenomenon. The sensed data may correspond to a position and an orientation of the water vehicle 100. In some embodiments, the position comprises a GPS position. In some embodiments, the orientation comprises a pitch angle, a roll angle, a yaw angle, a compass heading, or any combination thereof. In some embodiments, the sensor 108 comprises a GPS sensor, an accelerometer, a tilt sensor, an inertial sensor, a compass, a magnetic sensor, a potentiometer, an Automatic Identification System (AIS) sensor, or any combination thereof. In some embodiments, the sensor 108 comprises a GPS sensor. In some embodiments, the sensor 108 comprises a non-GPS sensor. In some embodiments, the non-GPS sensor comprises a compass, a sextant, a camera, an inertial sensor, or any combination thereof. In some embodiments, the non-GPS sensor measures a position of the water vehicle 100 using celestial sightings or any other non-satellite based methods.

In some embodiments, the sensor 108 consists of a GPS sensor and at least one of an inertial sensor configured to measure an inertial data, a compass configured to measure a heading, a potentiometer configured to measure an angle, an Automatic Identification System (AIS) sensor configured to measure an AIS data, or any combination thereof. In some embodiments, the sensor consists of a GPS sensor and at least one of the inertial sensor, the compass, and the AIS sensor, wherein the signal interception module determines the position of origin of at least one of the HF signal and the VHF signal based on at least one of the inertial data and the magnetic data if the position of the water vehicle is within a GPS denied environment. In some embodiments, the sensor consists of a GPS sensor and at least one of the inertial sensor, the compass, and the AIS sensor, wherein the signal interception module determines the position of origin of at least one of the HF signal and the VHF signal, the angle of origin of at least one of the HF signal and the VHF signal, or both.

Vehicle Communication Device

In some embodiments, the vehicle communications device 106 comprises a satellite communication device, a Wi-Fi communication device, an RFID communication device, a Bluetooth communication device, a mesh network communication device, an over-the-horizon communication device, or any combination thereof. In some embodiments, the vehicle communications device 106 consists of the Wi-Fi communication device and wherein the Wi-Fi communication device is only enabled for local diagnostics. In some embodiments, the vehicle communications device 106 transmits at least one of the HF signal, the VHF signal, the position of origin of the HF signal, the position of origin of the VHF signal, the angle of origin of the HF signal, and the angle of origin of the VHF signal by VPN, Web Socket, JSON, HTTP, HTTPS or any combination thereof. The satellite antenna 106 may be configured to receive mission planning and navigational data. The satellite antenna 106 may comprise a horizon satellite antenna, a line-of-sight satellite antenna, a cellular antenna, a laser antenna, a Wi-Fi antenna, a mesh network antenna, or any combination thereof. The satellite antenna 106 may be configured for passive signal phase detection, active passive signal phase detection, antenna grid detection, electronic scanning detection, non-visual frequency detection, or any combination thereof. The satellite antenna 106 may be configured for encrypted communications.

Payload Application

The vehicle processor may be configured to provide a payload application, e.g., a payload computer program. The payload application may comprise a signal interception module, and a data exfiltration module. In some embodiments, the payload application further comprises an encryption module encrypting at least one of the HF signal, the VHF signal, the position of origin of the HF signal, the position of origin of the VHF signal, the angle of origin of the HF signal, the angle of origin of the VHF signal and the sensed data. The encryption module may encrypt at least one of the HF signal, the VHF signal, the position of origin of the HF signal, the position of origin of the VHF signal, the angle of origin of the HF signal, the angle of origin of the VHF signal and the sensed data before saving to memory, transmission, or both.

The signal interception module may be configured to receive the sensed data, the HF signal, and the VHF signal. The signal interception module may be configured to determine a position of origin an angle of origin or both of at least one of the HF signal and the VHF signal, or both. The signal interception module may be configured to determine a position of origin an angle of origin or both of at least one of the HF signal and the VHF signal, or both based on the sensed data. The sensed data may comprise a GPS sensed data and at least one of an inertial sensed data and a magnetic sensed data. The signal interception module may determine a position of origin, an angle of origin or both of at least one of the HF signal and the VHF signal by geo-correlating the received signal with at least one of the position and the orientation of the water vehicle. The signal interception module may determine a position of origin an angle of origin or both of at least one of the HF signal and the VHF signal by geo-correlating the received signal with the GPS sensed data and at least one of an inertial sensed data and a magnetic sensed data.

The signal interception module may determine the position of origin the angle of origin or both of at least one of the HF signal and the VHF signal based on at least one of the inertial data and the magnetic data if the position of the water vehicle is within a GPS denied environment. The GPS denied environment may comprise a geography that is not in connection with a GPS satellite. The GPS denied environment may comprise a geography that is not in direct line-of-sight with a GPS satellite. The GPS denied environment may comprise a geography wherein the GPS signal is jammed or purposefully compromised. The GPS denied environment may be determined by predetermined maps, the strength of the GPS signal, or both. The GPS denied environment may be determined if the strength of the GPS signal is below a certain signal strength threshold. The predetermined signal strength may comprise a set signal strength or a variable signal strength. The variable signal strength may be altered depending on a require task.

In some embodiments, the signal interception module determines the position of origin, the angle of origin, or both, of the HF signal by: determining a false direction or a true direction of the HF signal; and directing the propulsion and steering system to modify the position, the orientation, or both, of the water vehicle until a true direction of the HF signal is determined. In some embodiments, wherein the signal interception module determines the position of origin, the angle of origin, or both, of the HF signal by: calculating a phase difference of the arrival of the HF signal received by the HF array; calculating a signal strength difference of the HF signal received by the HF array; or both.

The data exfiltration module may transmit at least one of the HF signal, the VHF signal, the position of the water vehicle, the orientation of the water vehicle, and the position of origin. The data exfiltration module may transmit at least one of the HF signal, the VHF signal, the position of the water vehicle, the orientation of the water vehicle, and the position of origin, the angle of origin, or both via the water vehicle communications device. The data exfiltration module may transmit at least one of the HF signal, the VHF signal, the position of the water vehicle, the orientation of the water vehicle, and the position of origin, the angle of origin, or both via the water vehicle communications device to a control station. The control station may comprise a land-based control station, a sea-based control station, an air-based control station, a space-based control station, or any combination thereof.

In some embodiments, the signal interception module determines the position of origin of the VHF signal by: calculating a phase difference of arrival of the VHF signal received by the VHF array; calculating a signal strength difference of the VHF signal received by the VHF array; or both. In some embodiments, the payload application further comprises a memory module storing one or more of the HF signal, the VHF signal, the position of origin of the HF signal, and the position of origin, the angle of origin, or both, of the VHF signal. In some embodiments, the memory module only stores at least one of the HF signal, the VHF signal, the position of origin, the angle of origin, or both of the HF signal, and the position of origin, the angle of origin, or both of the VHF signal if at least one of the HF signal and the VHF signal has: a signal-to-noise value below a set noise threshold; a frequency within a set frequency range; an amplitude above a set amplitude value; or any combination thereof. In some embodiments, the communications device only transmits at least one of the HF signal, the VHF signal, the position of origin, the angle of origin, or both of the HF signal, and the position of origin, the angle of origin, or both of the VHF signal if at least one of the HF signal and the VHF signal has: a signal-to-noise value below a set noise threshold; a frequency within a set frequency range; an amplitude above a set amplitude value; or any combination thereof.

The payload application may enable direct Wi-Fi connection for local diagnostics during inactive maintenance and testing.

Control Station

The control station may comprise a land-based control station, a sea-based control station, an air-based control station, a space-based control station, or any combination thereof. The control station may comprise one or more control station processors. The control station processor may be configured to provide a shoreside application. The shoreside application may comprise a communication module receiving the position of origin, the angle of origin, or both and at least one of the position and orientation of the water vehicle. In some embodiments, the shoreside application further comprises an encryption module decrypting at least one of the HF signal, the VHF signal, the position of origin, the angle of origin, or both, of the HF signal, and the position of origin, the angle of origin, or both, of the VHF signal.

Terms and Definitions

Unless otherwise defined, all technical terms used herein have the same meaning as commonly understood by one of ordinary skill in the art to which this disclosure belongs.

As used herein, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by 10%, 5%, or 1%, including increments therein. As used herein, the term "about" in relation to a percentage refers to an amount that is greater or less the stated amount by 10%, 5%, or 1%, including increments therein.

As used herein, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together.

Processor(s)

In some embodiments, the platforms, systems, vehicles, media, and methods described herein include one or more processors (e.g., computing devices, computers, etc.) or use of the same. In further embodiments, the processor includes one or more hardware central processing units (CPUs) and/or general purpose graphics processing units (GPGPUs) that carry out functions. In still further embodiments, the processor further comprises an operating system configured to perform executable instructions. In some embodiments, the processor is optionally connected a computer network. In further embodiments, the processor is optionally connected to the Internet such that it accesses the World Wide Web. In still further embodiments, the processor is optionally connected to a cloud computing infrastructure. In other embodiments, the processor is optionally connected to an intranet. In other embodiments, the processor is optionally connected to a data storage device.

In accordance with the description herein, suitable processors include, by way of non-limiting examples, server computers, desktop computers, laptop computers, notebook computers, sub-notebook computers, netbook computers, netpad computers, handheld computers, Internet appliances, mobile smartphones, tablet computers, and vehicles.

In some embodiments, the processor includes an operating system configured to perform executable instructions. The operating system is, for example, software, including programs and data, which manages hardware and provides services for execution of applications. Those of skill in the art will recognize that suitable server operating systems include, by way of non-limiting examples, FreeBSD, OpenBSD, NetBSD Linux, Apple® Mac OS X ServerOracle® Solaris®, Windows Server®, and Novell® NetWare®. Those of skill in the art will recognize that suitable personal computer operating systems include, by way of non-limiting examples, Microsoft® Windows®, Apple® Mac OS X®, UNIX®, and UNIX-like operating systems such as GNU/Linux. In some embodiments, the operating system is provided by cloud computing. Those of skill in the art will also recognize that suitable mobile smart phone operating systems include, by way of non-limiting examples, Nokia® Symbian® OS, Apple® iOS®, Research In Motion® BlackBerry OS®, Google® Android®, Microsoft® WindowsPhone® OS, Microsoft® WindowsMobile® OS, Linux®, and Palm® WebOS®.

In some embodiments, the processor includes a storage and/or memory device. The storage and/or memory device is one or more physical apparatuses used to store data or programs on a temporary or permanent basis. In some embodiments, the device is volatile memory and requires power to maintain stored information. In some embodiments, the device is non-volatile memory and retains stored information when the digital processing device is not powered. In further embodiments, the non-volatile memory comprises flash memory. In some embodiments, the non-volatile memory comprises dynamic random-access memory (DRAM). In some embodiments, the non-volatile memory comprises ferroelectric random access memory (FRAM). In some embodiments, the non-volatile memory comprises phase-change random access memory (PRAM). In other embodiments, the device is a storage device including, by way of non-limiting examples, CD-ROMs, DVDs, flash memory devices, magnetic disk drives, magnetic tapes drives, optical disk drives, and cloud computing based storage. In further embodiments, the storage and/or memory device is a combination of devices such as those disclosed herein.

In some embodiments, the processor includes a display to send visual information to a user. In some embodiments, the display is a liquid crystal display (LCD). In further embodiments, the display is a thin film transistor liquid crystal display (TFT-LCD). In some embodiments, the display is an organic light emitting diode (OLED) display. In various further embodiments, on OLED display is a passive-matrix OLED (PMOLED) or active-matrix OLED (AMOLED) display. In some embodiments, the display is a plasma display. In other embodiments, the display is a video projector. In yet other embodiments, the display is a head-mounted display in communication with the digital processing device, such as a VR headset. In further embodiments, suitable VR headsets include, by way of non-limiting examples, HTC Vive, Oculus Rift, Samsung Gear VR, Microsoft HoloLens, Razer OSVR, FOVE VR, Zeiss VR One, Avegant Glyph, Freefly VR headset, and the like. In still further embodiments, the display is a combination of devices such as those disclosed herein.

In some embodiments, the processor includes an input device to receive information from a user. In some embodiments, the input device is a keyboard. In some embodiments, the input device is a pointing device including, by way of non-limiting examples, a mouse, trackball, track pad, joystick, game controller, or stylus. In some embodiments, the input device is a touch screen or a multi-touch screen. In other embodiments, the input device is a microphone to capture voice or other sound input. In other embodiments, the input device is a video camera or other sensor to capture motion or visual input. In further embodiments, the input device is a Kinect, Leap Motion, or the like. In still further embodiments, the input device is a combination of devices such as those disclosed herein.

Figure 8:
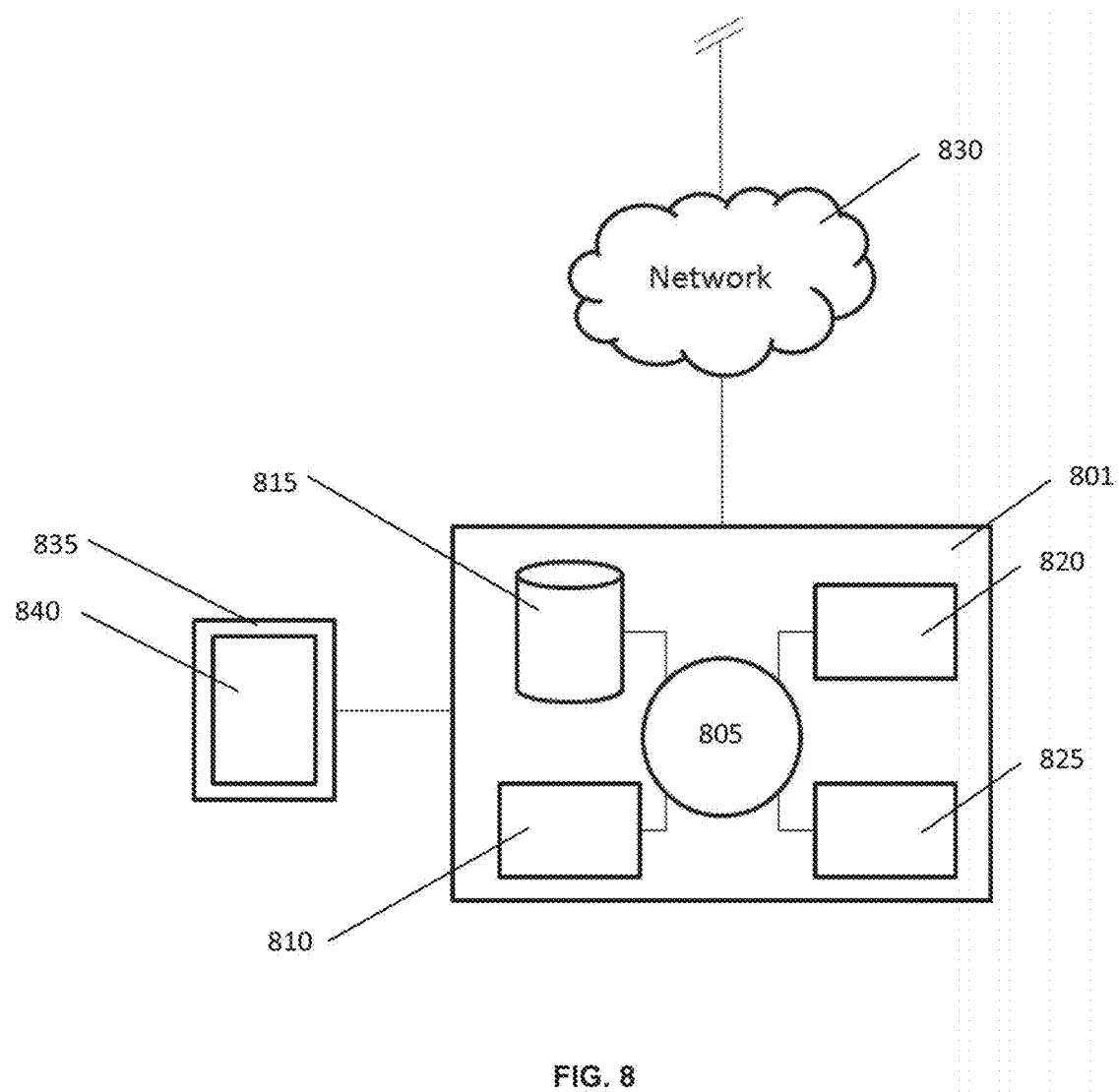
FIG. 8 shows a schematic diagram of a non-limiting digital processing device; in this case, a device with one or more CPUs, a memory, a communication interface, and a display, in accordance with an embodiment herein.

Referring to FIG. 8, in a particular embodiment, a processor 801 is programmed or otherwise configured to provide a physical signals interception system. The processor 801 is programmed or otherwise configured to provide a physical signals interception system. In this embodiment, the processor 801 includes a central processing unit (e.g., CPU) 805, which optionally comprises a single core processor, a multi core processor, and/or a plurality of processors for parallel processing. The processor 801 also includes memory or memory location 810 (e.g., random-access memory, read-only memory, flash memory), electronic storage unit 815 (e.g., one or more hard disks and/or one or more solid state drives), communication interface 820 (e.g., network adapter) for communicating with one or more other systems, and peripheral devices 825, such as cache, other memory, data storage and/or electronic display adapters. The memory 810, storage unit 815, interface 820, internal peripheral devices 825, and/or external peripheral devices 835 are in communication with the CPU 805 through a communication bus (solid lines), such as a motherboard. The storage unit 815 comprises a data storage unit (or data repository) for storing data. The processor 801 is optionally operatively coupled to a computer network ("network") 830 with the aid of the communication interface 820. The network 830, in various cases, is the Internet, an intranet, and/or extranet, or an intranet and/or extranet that is in communication with the Internet. The network 830, in some cases, is a telecommunication and/or data network. The network 830 optionally includes one or more computer servers, which enable distributed computing, such as cloud computing. The network 830, in some cases, with the aid of the processor 801, implements a peer-to-peer network, which enables devices coupled to the processor 801 to behave as a client or a server.

Continuing to refer to FIG. 8, the CPU 805 is configured to execute a sequence of machine-readable instructions, embodied in a program, application, and/or software. The instructions are optionally stored in a memory location, such as the memory 810. The instructions are directed to the CPU 805, which subsequently program or otherwise configure the CPU 805 to implement methods of the present disclosure. Examples of operations performed by the CPU 805 include fetch, decode, execute, and write back. The CPU 805 is, in some cases, part of a circuit, such as an integrated circuit. One or more other components of the processor 801 are optionally included in the circuit. In some cases, the circuit is an application specific integrated circuit (ASIC) or a field programmable gate array (FPGA).

Continuing to refer to FIG. 8, the storage unit 815 optionally stores files, such as drivers, libraries and saved programs. The storage unit 815 optionally stores user data, e.g., user preferences and user programs. The processor 801, in some cases, includes one or more additional data storage units that are external, such as located on a remote server that is in communication through an intranet or the Internet.

Continuing to refer to FIG. 8, the processor 801 optionally communicates with one or more remote computer systems through the network 830. For instance, the device 801 optionally communicates with a remote computer system of a user. Examples of remote computer systems include personal computers (e.g., portable PC), slate or tablet PCs (e.g., Apple® iPad, Samsung® Galaxy Tab, etc.), smartphones (e.g., Apple® iPhone, Android-enabled device, etc.), or personal digital assistants.

Methods as described herein are optionally implemented by way of machine (e.g., computer processor) executable code stored on an electronic storage location of the digital processing device 101, such as, for example, on the memory 810 or electronic storage unit 815. The machine executable or machine readable code is optionally provided in the form of software. During use, the code is executed by the CPU 805. In some cases, the code is retrieved from the storage unit 815 and stored on the memory 810 for ready access by the CPU 805. In some situations, the electronic storage unit 815 is precluded, and machine-executable instructions are stored on the memory 810.

Non-Transitory Computer Readable Storage Medium

In some embodiments, the platforms, systems, vehicles, media, and methods disclosed herein include one or more non-transitory computer readable storage media encoded with a program including instructions executable by the operating system of an optionally networked processor. In further embodiments, a computer readable storage medium is a tangible component of a processor. In still further embodiments, a computer readable storage medium is optionally removable from a processor. In some embodiments, a computer readable storage medium includes, by way of non-limiting examples, CD-ROMs, DVDs, flash memory devices, solid state memory, magnetic disk drives, magnetic tape drives, optical disk drives, cloud computing systems and services, and the like. In some cases, the program and instructions are permanently, substantially permanently, semi-permanently, or non-transitorily encoded on the media.

Computer Program

In some embodiments, the platforms, systems, vehicles, media, and methods disclosed herein include at least one computer program (e.g., application or computer application), or use of the same. A computer program includes a sequence of instructions, executable in the digital processing device's CPU, written to perform a specified task. Computer readable instructions may be implemented as program modules, such as functions, objects, Application Programming Interfaces (APIs), data structures, and the like, that perform particular tasks or implement particular abstract data types. In light of the disclosure provided herein, those of skill in the art will recognize that a computer program may be written in various versions of various languages.

The functionality of the computer readable instructions may be combined or distributed as desired in various environments. In some embodiments, a computer program comprises one sequence of instructions. In some embodiments, a computer program comprises a plurality of sequences of instructions. In some embodiments, a computer program is provided from one location. In other embodiments, a computer program is provided from a plurality of locations. In various embodiments, a computer program includes one or more software modules. In various embodiments, a computer program includes, in part or in whole, one or more web applications, one or more mobile applications, one or more standalone applications, one or more web browser plug-ins, extensions, add-ins, or add-ons, or combinations thereof.

Web Application

In some embodiments, a computer program includes a web application. In light of the disclosure provided herein, those of skill in the art will recognize that a web application, in various embodiments, utilizes one or more software frameworks and one or more database systems. In some embodiments, a web application is created upon a software framework such as Microsoft .NET or Ruby on Rails (RoR). In some embodiments, a web application utilizes one or more database systems including, by way of non-limiting examples, relational, non-relational, object oriented, associative, and XML database systems. In further embodiments, suitable relational database systems include, by way of non-limiting examples, Microsoft® SQL Server, mySQL™, and Oracle®. Those of skill in the art will also recognize that a web application, in various embodiments, is written in one or more versions of one or more languages. A web application may be written in one or more markup languages, presentation definition languages, client-side scripting languages, server-side coding languages, database query languages, or combinations thereof. In some embodiments, a web application is written to some extent in a markup language such as Hypertext Markup Language (HTML), Extensible Hypertext Markup Language (XHTML), or eXtensible Markup Language (XML). In some embodiments, a web application is written to some extent in a presentation definition language such as Cascading Style Sheets (CSS). In some embodiments, a web application is written to some extent in a client-side scripting language such as Asynchronous JavaScript and XML (AJAX), Flash® ActionScript, JavaScript, or Silverlight®. In some embodiments, a web application is written to some extent in a server-side coding language such as Active Server Pages (ASP), ColdFusion®, Perl, Java™, JavaServer Pages (JSP), Hypertext Preprocessor (PHP), Python™, Ruby, Tcl, Smalltalk, WebDNA®, or Groovy. In some embodiments, a web application is written to some extent in a database query language such as Structured Query Language (SQL). In some embodiments, a web application integrates enterprise server products such as IBM® Lotus Domino®. In some embodiments, a web application includes a media player element. In various further embodiments, a media player element utilizes one or more of many suitable multimedia technologies including, by way of non-limiting examples, Adobe® Flash®, HTML 5, Apple® QuickTime®, Microsoft® Silverlight®, Java™, and Unity®.

Figure 9:
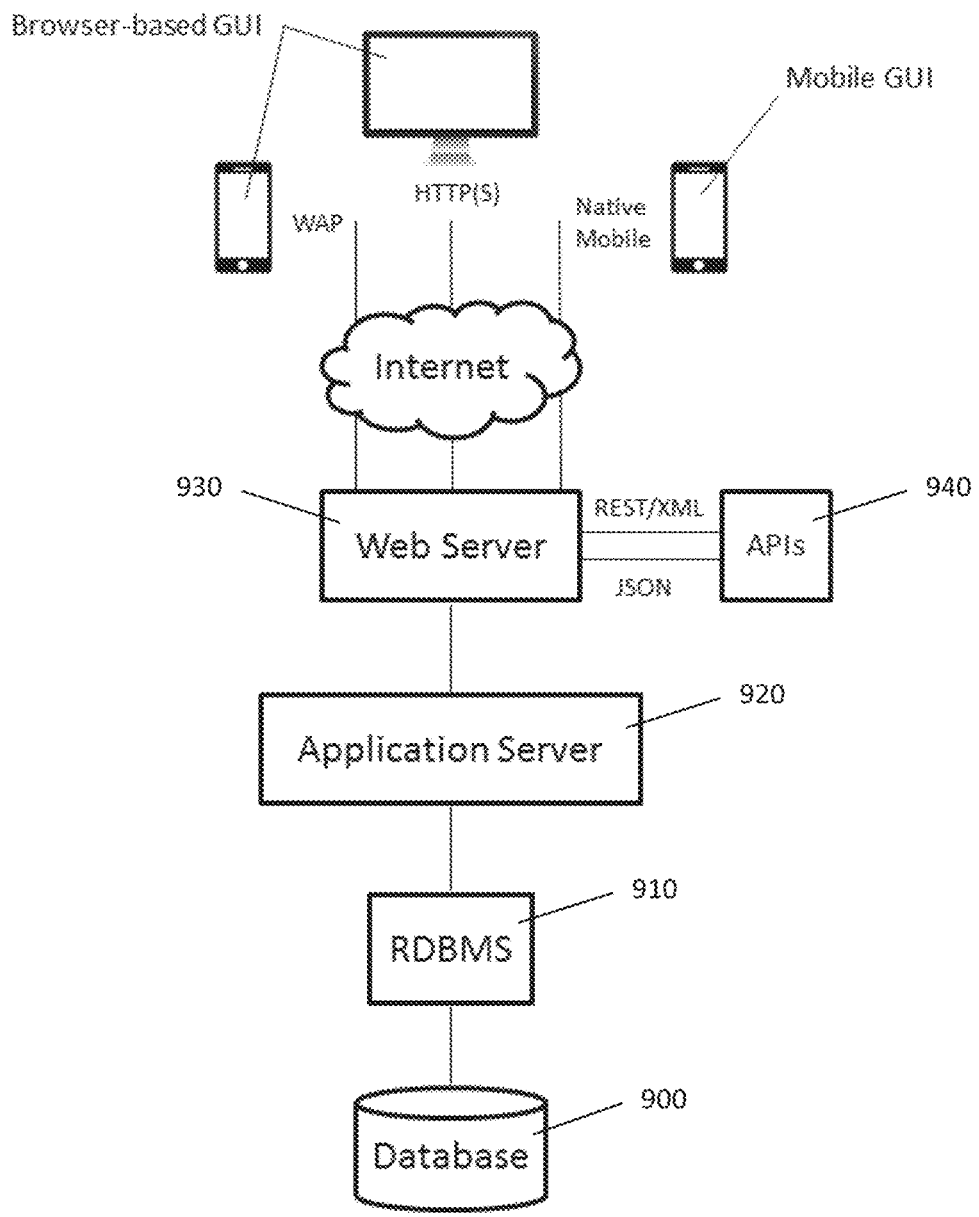
FIG. 9 shows a schematic diagram of a non-limiting web/mobile application provision system; in this case, a system providing browser-based and/or native mobile user interfaces, in accordance with an embodiment herein.

Referring to FIG. 9, in a particular embodiment, an application provision system comprises one or more databases 900 accessed by a relational database management system (RDBMS) 910. Suitable RDBMSs include Firebird, MySQL, PostgreSQL, SQLite, Oracle Database, Microsoft SQL Server, IBM DB2, IBM Informix, SAP Sybase, SAP Sybase, Teradata, and the like. In this embodiment, the application provision system further comprises one or more application severs 920 (such as Java servers, .NET servers, PHP servers, and the like) and one or more web servers 930 (such as Apache, IIS, GWS and the like). The web server(s) optionally expose one or more web services via app application programming interfaces (APIs) 940. Via a network, such as the Internet, the system provides browser-based and/or mobile native user interfaces.

Figure 10:
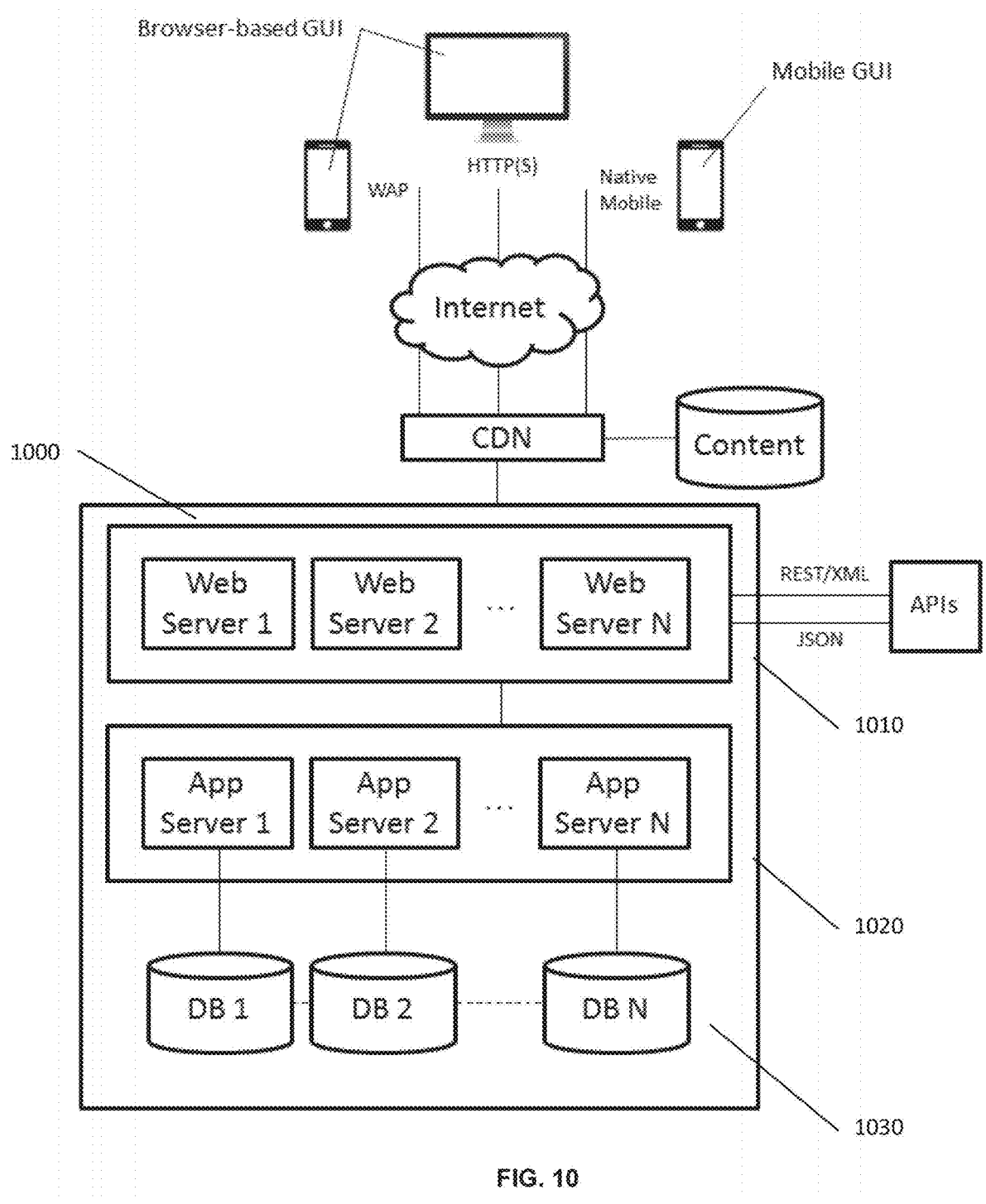
FIG. 10 shows a schematic diagram of a non-limiting cloud-based web/mobile application provision system; in this case, a system comprising an elastically load balanced, auto-scaling web server and application server resources as well synchronously replicated databases, in accordance with an embodiment herein.

Referring to FIG. 10, in a particular embodiment, an application provision system alternatively has a distributed, cloud-based architecture 1000 and comprises elastically load balanced, auto-scaling web server resources 1010, and application server resources 1020 as well synchronously replicated databases 1030.

Mobile Application

In some embodiments, a computer program includes a mobile application provided to a mobile digital processing device. In some embodiments, the mobile application is provided to a mobile digital processing device at the time it is manufactured. In other embodiments, the mobile application is provided to a mobile digital processing device via the computer network described herein.

In view of the disclosure provided herein, a mobile application is created by techniques known to those of skill in the art using hardware, languages, and development environments known to the art. Those of skill in the art will recognize that mobile applications are written in several languages. Suitable programming languages include, by way of non-limiting examples, C, C++, C#, Objective-C, Java™, JavaScript, Pascal, Object Pascal, Python™, Ruby, VB.NET, WML, and XHTML/HTML with or without CSS, or combinations thereof.

Suitable mobile application development environments are available from several sources. Commercially available development environments include, by way of non-limiting examples, AirplaySDK, alcheMo, Appcelerator®, Celsius, Bedrock, Flash Lite, .NET Compact Framework, Rhomobile, and WorkLight Mobile Platform. Other development environments are available without cost including, by way of non-limiting examples, Lazarus, MobiFlex, MoSync, and Phonegap. Also, mobile device manufacturers distribute software developer kits including, by way of non-limiting examples, iPhone and iPad (iOS) SDK, Android™ SDK, BlackBerry® SDK, BREW SDK, Palm® OS SDK, Symbian SDK, webOS SDK, and Windows® Mobile SDK.

Standalone Application

In some embodiments, a computer program includes a standalone application, which is a program that is run as an independent computer process, not an add-on to an existing process, e.g., not a plug-in. Those of skill in the art will recognize that standalone applications are often compiled. A compiler is a computer program(s) that transforms source code written in a programming language into binary object code such as assembly language or machine code. Suitable compiled programming languages include, by way of non-limiting examples, C, C++, Objective-C, COBOL, Delphi, Eiffel, Java™, Lisp, Python™, Visual Basic, and VB.NET, or combinations thereof. Compilation is often performed, at least in part, to create an executable program. In some embodiments, a computer program includes one or more executable complied applications.

Software Modules

In some embodiments, the platforms, systems, vehicles, media, and methods disclosed herein include software, server, and/or database modules, or use of the same. In view of the disclosure provided herein, software modules are created by techniques known to those of skill in the art using machines, software, and languages known to the art. The software modules disclosed herein are implemented in a multitude of ways. In various embodiments, a software module comprises a file, a section of code, a programming object, a programming structure, or combinations thereof. In further various embodiments, a software module comprises a plurality of files, a plurality of sections of code, a plurality of programming objects, a plurality of programming structures, or combinations thereof. In various embodiments, the one or more software modules comprise, by way of non-limiting examples, a web application, a mobile application, and a standalone application. In some embodiments, software modules are in one computer program or application. In other embodiments, software modules are in more than one computer program or application. In some embodiments, software modules are hosted on one machine. In other embodiments, software modules are hosted on more than one machine. In further embodiments, software modules are hosted on cloud computing platforms. In some embodiments, software modules are hosted on one or more machines in one location. In other embodiments, software modules are hosted on one or more machines in more than one location.

Databases

In some embodiments, the platforms, systems, vehicles, media, and methods disclosed herein include one or more databases, or use of the same. In view of the disclosure provided herein, those of skill in the art will recognize that many databases are suitable for the physical signals interception, recording, and intelligence systems described herein. In various embodiments, suitable databases include, by way of non-limiting examples, relational databases, non-relational databases, object oriented databases, object databases, entity-relationship model databases, associative databases, and XML databases. Further non-limiting examples include SQL, PostgreSQL, MySQL, Oracle, DB2, and Sybase. In some embodiments, a database is Internet-based. In further embodiments, a database is web-based. In still further embodiments, a database is cloud computing-based. In other embodiments, a database is based on one or more local computer storage devices.

EXAMPLES

The following illustrative examples are representative of embodiments of the software applications, systems, and methods described herein and are not meant to be limiting in any way.

Example 1—VHF Signals

In one example, the VHF array of the physical signals interception system receives a signal from an unidentified ocean vessel. The signal interception module of the payload application receives the VHF signal and a sensed data from a GPS sensor and an inertial sensor. The signal interception module then determines a position of origin of the VHF signal by calculating a phase difference of the VHF signal at the four VHF antennas and VHF counterpoise antennas, and geo-correlating the phase difference with the GPS sensed data and the inertial sensed data. As the signal-to-noise value is below a set noise threshold, the memory module then stores, encrypts, and transmits the VHF signal and the position of origin.

Example 2—HF Signals

In one example, the HF array of the physical signals interception system receives a signal from an unidentified land-based transmitter. The signal interception module of the payload application receives the HF signal and a sensed data from a GPS sensor and an inertial sensor. The signal interception module then determines a position of origin of the HF signal by determining a false direction and a true direction of the HF signal from HF signals received during two or more discrete times. The phase difference of the HF signal from the four HF antennas is then geo-correlated with the GPS sensed data and the inertial sensed data to determine a position of origin. As the frequency within a set frequency range, the memory module then stores, encrypts, and transmits the HF signal and the position of origin.

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the subject matter described herein may be employed in practice.

What is claimed is:

1. An unmanned water vehicle for signal interception, recording, and intelligence comprising a physical signals interception system comprising:
   a) a High Frequency (HF) antenna array configured to receive a HF signal;
   b) a Very High Frequency (VHF) antenna array configured to receive a VHF signal;
   c) at least one sensor configured to measure a sensed data corresponding to a position and an orientation of the unmanned water vehicle;
   d) a vehicle communications device; and
   e) a vehicle processor configured to provide a payload application comprising:
      i) a signal interception module configured to:
         I. receive the sensed data, the HF signal, and the VHF signal; and
         II. determining a position of origin of at least one of the HF signal and the VHF signal by geo-correlating at least one of the position and orientation of the unmanned water vehicle; and
      ii) a data exfiltration module transmitting at least one of the HF signal, the VHF signal, the position of the unmanned water vehicle, the orientation of the unmanned water vehicle, and the position of origin via the water vehicle communications device.

2. The unmanned water vehicle of claim 1, further comprising an energy storage device.

3. The unmanned water vehicle of claim 2, wherein the energy storage device comprises a battery, a supercapacitor, a hybrid supercapacitor, a spring, or any combination thereof.

4. The unmanned water vehicle of claim 1, wherein the position comprises a GPS position.

5. The unmanned water vehicle of claim 1, wherein the at least one sensor comprises a GPS sensor.

6. The unmanned water vehicle of claim 1, wherein the at least one sensor comprises a non-GPS sensor.

7. The unmanned water vehicle of claim 6, wherein the non-GPS sensor comprises a compass, a sextant, a camera, an inertial sensor, or any combination thereof.

8. The unmanned water vehicle of claim 1, wherein the orientation comprises a pitch angle, a roll angle, and a yaw angle.

9. The unmanned water vehicle of claim 1, further comprising an energy harvesting device.

10. The unmanned water vehicle of claim 9, wherein the energy harvesting device comprises a solar panel, a wind turbine, a kite, a buoy, or any combination thereof.

11. The unmanned water vehicle of claim 1, wherein at least one of the HF signal and the VHF signal comprises a signal emitted by a ship, a ground stations, or an aircraft.

12. The unmanned water vehicle of claim 1, wherein the HF signal comprises a first spectrum of HF signals and wherein the VHF signal comprises a second spectrum of VHF signals.

13. The unmanned water vehicle of claim 1, wherein the HF antenna array comprises two HF antennas separated by a HF baseline distance.

14. The unmanned water vehicle of claim 13, wherein the HF baseline distance is about 2.5 meters to about 25 meters.

15. The unmanned water vehicle of claim 1, wherein the VHF antenna array comprises a circular array of VHF antennas, a rectilinear array of VHF antennas, or a phased array of VHF antennas.

16. The unmanned water vehicle of claim 15, wherein the circular VHF antenna array has a diameter of about 0.2 meters to about 1 meter.

17. The unmanned water vehicle of claim 15, wherein the VHF antenna array further comprises a counterpoise VHF antenna.

18. The unmanned water vehicle of claim 17, wherein the VHF antenna array comprises four counterpoise VHF antennas and wherein each counterpoise VHF antenna is generally coaxial with one VHF antenna.

19. The unmanned water vehicle of claim 1, wherein the unmanned water vehicle further comprises a stanchion, and wherein at least one of the HF array and the VHF array is attached to the stanchion.

20. The unmanned water vehicle of claim 19, wherein the stanchion has a height of about 0.8 meters to about 8 meters.

21. The unmanned water vehicle of claim 1, wherein the reception area of at least one of the HF array and the VHF array is at least about 5 kilometers.

22. The unmanned water vehicle of claim 1, wherein the reception area of at least one of the HF array and the VHF array is about 5 kilometers to about 200 kilometers.

23. The unmanned water vehicle of claim 1, wherein the sensor comprises a GPS sensor configured to measure a GPS data, an accelerometer configured to measure an acceleration data, a tilt sensor configured to measure a tilt data, an inertial sensor configured to measure an inertial data, a compass configured to measure a heading, a potentiometer configured to measure an angle, an Automatic Identification System (AIS) sensor configured to measure an AIS data, or any combination thereof.

24. The unmanned water vehicle of claim 23, wherein the sensor consists of a GPS sensor and at least one of the inertial sensor, the compass, and the AIS sensor, and wherein the signal interception module determines the position of origin of at least one of the HF signal and the VHF signal based on at least one of the inertial data and the magnetic data if the position of the unmanned water vehicle is within a GPS denied environment.

25. The unmanned water vehicle of claim 1, wherein vehicle communications device comprises a satellite communication device, a Wi-Fi communication device, an RFID communication device, a Bluetooth communication device, a mesh network communication device, an over-the-horizon communication device, or any combination thereof.

26. The unmanned water vehicle of claim 25, wherein the vehicle communications device consists of the Wi-Fi communication device and wherein the Wi-Fi communication device is only enabled for local diagnostics.

27. The unmanned water vehicle of claim 1, further comprising a propulsion and steering system configured to modify the position and the orientation of the unmanned water vehicle.

28. The unmanned water vehicle of claim 27, wherein the propulsion and steering system comprises a motor, a wave glider, a rudder, a propeller, an anchor, a sail, a kite, a jet, or any combination thereof.

29. The unmanned water vehicle of claim 1, wherein the signal interception module determines the position of origin of the HF signal by determining a false direction and a true direction of the HF signal from HF signals received during two or more discrete times.

30. The unmanned water vehicle of claim 1, wherein the signal interception module determines the position of origin of the HF signal by:
   a) calculating a phase difference of the arrival of the HF signal received by the HF array;
   b) calculating a signal strength difference of the HF signal received by the HF array; or
   c) both.

31. The unmanned water vehicle of claim 1, wherein the direction finding module determines the position of origin of the VHF signal by:
   a) calculating a phase difference of arrival of the VHF signal received by the VHF array;
   b) calculating a signal strength difference of the VHF signal received by the VHF array; or
   c) both.

32. The unmanned water vehicle of claim 1, wherein the payload application further comprises a memory module storing one or more of the HF signal, the VHF signal, the position of origin of the HF signal, and the position of origin of the VHF signal.

33. The unmanned water vehicle of claim 32, wherein the memory module only stores at least one of the HF signal, the VHF signal, the position of origin of the HF signal, and the position of origin of the VHF signal if at least one of the HF signal and the VHF signal has:
   a) a signal-to-noise value below a set noise threshold;
   b) a frequency within a set frequency range;
   c) an amplitude above a set amplitude value; or
   d) any combination thereof.

34. The unmanned water vehicle of claim 1, wherein the communications device only transmits at least one of the HF signal, the VHF signal, the position of origin of the HF signal, and the position of origin of the VHF signal if at least one of the HF signal and the VHF signal has:
   a) a signal-to-noise value below a set noise threshold;
   b) a frequency within a set frequency range;
   c) an amplitude above a set amplitude value; or
   d) any combination thereof.

35. The unmanned water vehicle of claim 1, wherein the payload application further comprises an encryption module encrypting at least one of the HF signal, the VHF signal, the position of origin of the HF signal, and the position of origin of the VHF signal.

36. The unmanned water vehicle of claim 1, wherein the vehicle communications device transmits at least one of the HF signal, the VHF signal, the position of origin of the HF signal, and the position of origin of the VHF signal by VPN, WebSocket, JSON, HTTP, HTTPS, or any combination thereof.

37. The unmanned water vehicle of claim 1, capable of continuous operation for at least 45 days without maintenance or charging.

38. An unmanned water-based signal interception, recording, and intelligence platform comprising:
   a) an unmanned water vehicle comprising:
      i) a High Frequency (HF) antenna array configured to receive a HF signal;
      ii) a Very High Frequency (VHF) antenna array configured to receive a VHF signal;
      iii) at least one sensor configured to measure a sensed data corresponding to the position and the orientation of the unmanned water vehicle;
      iv) a vehicle communications device; and
      v) a vehicle processor configured to provide a payload application comprising:
         (1) a signal interception module configured to: receive the sensed data, the HF signal, and the VHF signal; and determining a position of origin of at least one of the HF signal and the VHF signal by geo-correlating at least one of the position and orientation of the unmanned water vehicle; and
         (2) a data exfiltration module transmitting at least one of the HF signal, the VHF signal, the position of the unmanned water vehicle, the orientation of the unmanned water vehicle, and the position of origin via the water vehicle communications device; and
   b) a control station comprising a control station processor configured to provide a shoreside application comprising a communication module receiving the position of origin and at least one of the position and orientation of the unmanned water vehicle.

* * * * *

UNITED STATES PATENT AND TRADEMARK OFFICE
CERTIFICATE OF CORRECTION

Page 1 of 1

PATENT NO. : 10,994,821 B1
APPLICATION NO. : 16/712507
DATED : May 4, 2021
INVENTOR(S) : Michael Joseph Connor, Alex Lorman and William Glennie It is certified that error appears in the above-identified patent and that said Letters Patent is hereby corrected as shown below:

In the Claims

In Claim 1, Column 32, Line 10, please delete the word "determining" and replace it with --determine--

In Claim 11, Column 32, Line 44, please delete the word "stations" and replace it with --station--

In Claim 23, Column 33, Line 13, please delete the term "the sensor" and replace it with --the at least one sensor--

In Claim 24, Column 33, Line 23, please delete the term "the sensor" and replace it with --the at least one sensor--

In Claim 38, Column 34, Line 56, please delete the word "determining" and replace it with --determine--

In Claim 38, Column 34, Line 64, please delete the term "the water vehicle communications device" and replace it with --the vehicle communications device--

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*